United States Patent
Kedem et al.

(10) Patent No.: US 7,979,403 B2
(45) Date of Patent: Jul. 12, 2011

(54) METHOD AND SYSTEM FOR COMPRESSION OF FILES FOR STORAGE AND OPERATION ON COMPRESSED FILES

(75) Inventors: Nadav Kedem, Tel Aviv (IL); Jonathan Amit, Omer (IL); Noach Amit, Haifa (IL)

(73) Assignee: Storewize, Inc., Gaithersburg, MD (US)

( * ) Notice: Subject to any disclaimer, the term of this patent is extended or adjusted under 35 U.S.C. 154(b) by 188 days.

(21) Appl. No.: 11/401,424

(22) Filed: Apr. 11, 2006

(65) Prior Publication Data
US 2006/0184505 A1    Aug. 17, 2006

Related U.S. Application Data

(63) Continuation-in-part of application No. PCT/IL2005/000419, filed on Apr. 21, 2005.

(60) Provisional application No. 60/565,298, filed on Apr. 26, 2004.

(51) Int. Cl.
*G06F 17/30* (2006.01)
(52) U.S. Cl. ...................................................... 707/693
(58) Field of Classification Search ........................ None
See application file for complete search history.

(56) References Cited

U.S. PATENT DOCUMENTS

| | | | | |
|---|---|---|---|---|
| 5,305,295 A * | 4/1994 | Chu | ............................... | 711/202 |
| 5,481,701 A * | 1/1996 | Chambers, IV | ............... | 707/101 |
| 5,488,365 A * | 1/1996 | Seroussi et al. | ................. | 341/51 |
| 5,649,151 A * | 7/1997 | Chu et al. | ....................... | 711/111 |
| 5,761,536 A | 6/1998 | Franaszek | ........................ | 710/68 |
| 5,765,173 A * | 6/1998 | Cane et al. | .............................. | 1/1 |
| 5,774,715 A | 6/1998 | Madany et al. | ................ | 707/101 |
| 5,778,411 A * | 7/1998 | DeMoss et al. | ..................... | 711/4 |
| 5,809,295 A * | 9/1998 | Straub et al. | ....................... | 707/1 |
| 5,813,011 A * | 9/1998 | Yoshida et al. | ............... | 707/101 |
| 5,813,017 A | 9/1998 | Morris | ........................... | 707/204 |
| 5,991,753 A * | 11/1999 | Wilde | .................................. | 1/1 |
| 6,092,071 A | 7/2000 | Bolan et al. | .................... | 707/101 |
| 6,112,024 A * | 8/2000 | Almond et al. | ............... | 717/122 |
| 6,115,787 A | 9/2000 | Obara | ........................... | 711/113 |
| 6,349,375 B1 | 2/2002 | Faulkner et al. | .............. | 711/173 |
| 6,532,121 B1 * | 3/2003 | Rust et al. | ........................... | 360/8 |
| 6,577,734 B1 | 6/2003 | Etzel et al. | ..................... | 380/277 |

(Continued)

FOREIGN PATENT DOCUMENTS

EP    0 798 656 A2    10/1997

(Continued)

OTHER PUBLICATIONS

Shacham, A., et al. "IP Payload Compression Protocol (IPComp)". RFC 3173, Sep. 2001 <http://www.faqs.org/ftp/rfc/pdf/rfc3173.txt.pdf>.*

(Continued)

*Primary Examiner* — Mohammad Ali
*Assistant Examiner* — Syed H Hasan
(74) *Attorney, Agent, or Firm* — Griffiths & Seaton PLLC

(57) ABSTRACT

A method and system for creating, reading and writing compressed files for use with a file access storage. The compressed data of a raw file are packed into a plurality of compressed units and stored as compressed files. One or more corresponding compressed units may be read and/or updated with no need for restoring the entire file whilst maintaining de-fragmented structure of the compressed file.

23 Claims, 16 Drawing Sheets

U.S. PATENT DOCUMENTS

| | | | | |
|---|---|---|---|---|
| 6,584,520 | B1 | 6/2003 | Cowart et al. | 710/68 |
| 6,678,828 | B1 | 1/2004 | Pham et al. | 726/2 |
| 7,484,245 | B1* | 1/2009 | Friedman et al. | 726/27 |
| 2002/0035660 | A1* | 3/2002 | Tikkanen et al. | 711/1 |
| 2002/0056010 | A1 | 5/2002 | Lincoln et al. | |
| 2002/0107988 | A1 | 8/2002 | Jordan | |
| 2002/0143792 | A1* | 10/2002 | Belu | 707/200 |
| 2003/0084238 | A1* | 5/2003 | Okada et al. | 711/113 |
| 2004/0030813 | A1 | 2/2004 | Benveniste et al. | 710/22 |
| 2004/0064588 | A1 | 4/2004 | Jungck | |
| 2004/0255048 | A1* | 12/2004 | Lev Ran et al. | 709/249 |
| 2005/0021657 | A1 | 1/2005 | Negishi et al. | 709/213 |
| 2005/0033988 | A1* | 2/2005 | Chandrashekhar et al. | 713/201 |
| 2006/0015535 | A1* | 1/2006 | Buchsbaum et al. | 707/200 |

FOREIGN PATENT DOCUMENTS

| | | |
|---|---|---|
| WO | WO 95/29437 | 11/1995 |
| WO | WO 01/47243 | 6/2001 |

OTHER PUBLICATIONS

Gzip. "Gunzip, Gzcat, Gzip." MKSSoftware.com. 02022003. Web. Dec. 30, 2009.<http://web.archive.org/web/20030202222551/http://www.mkssoftware.com/docs/man1/gzip.1.asp>.*

Dave Marshall, "File Access and Directory System Calls". http://www.cs.cf.ac.uk/Dave/C/node20.html. Jan. 1999.*

EMC White Paper, "Leveraging Networked Storage for Your Business", Mar. 2003.

J. Ziv and A. Lempel, "A Universal Algorithm for Sequential Data Compression" IEEE Transactions on Information Theory, vol. IT-23, No. 3, May 1977, pp. 337-343.

Kampf F.A., "Performance as a function of compression", IBM Systems Journal, 1998, vol. 42, No. 6, pp. 1-2.

Pajarola et al. "An image compression method for spatial search", 2000, IEEE, pp. 358, 359 and 364.

Wee-Keong et al, "Block-oriented compression techniques for large statistical databases", Mar.-Apr. 1997, vol. 9, issue 2, pp. 318 section 3.2 and 321 section 4.3.

* cited by examiner

METHOD AND SYSTEM FOR COMPRESSION OF FILES FOR STORAGE AND OPERATION ON COMPRESSED FILES

This application is a Continuation In Part of PCT application No. PCT/IL2005/000419 of Apr. 21, 2005, which was published on Nov. 3, 2005 under publication No. WO 2005/103878, and claims the benefit of U.S. Provisional Patent Application No. 60/565,298, filed Apr. 26, 2004, the contents of all listed applications being hereby incorporated in their entirety.

FIELD OF THE INVENTION

This invention relates to computing systems and, in particular, to a method and apparatus facilitating compression and operation with compressed data over file systems protocols.

BACKGROUND OF THE INVENTION

In current business environment, all types of business data are becoming more and more critical to business success. The tremendous growth and complexity of business-generated data is driving the demand for information storage, defining the way of sharing, managing and protection of information assets.

Typically, no single technology or architecture is able to address all the needs of any organization. Main storage technologies are described, for example, in the White Paper by EMC, "Leveraging Networked storage for your business", March 2003, USA and basically can be identified by location and connection type (intra-computer storage, direct attached storage (DAS), IP, channel networks, etc.) and by the method that data is accessed. There are three basic types of storage architectures to consider in connection with methods of data access: Block Access, File Access, and Object Access.

In block access architecture, communication between a server/client and a storage medium occurs in terms of blocks; information is pulled block by block directly from the disk. The operation system keeps track of where each piece of information is on the disk, while the storage medium is usually not aware of the file system used to organize the data on the device. When something needs to be read or written, the data are directly accessed by a processor which knows where each block of data is located on the disk and how to put them together. Examples of block access storage technologies are DAS (Direct Attached Storage), SAN (Storage Area Network), Block Storage over IP (e.g. FCIP, iFCP, iSCSI, etc.), intra-memory storage, etc.

File access requires the server or client to request a file by name, not by physical location. As a result, a storage medium (external storage device, storage unit within computer, etc.) is usually responsible to map files back to blocks of data for creating, maintaining and updating the file system, while the block access is handled "behind the scene". Managing the space of storage media is provided by a file system. The file system provides a logical framework to the users of a computer system for accessing data stored in the storage media. The file system allows applications to create and manage files on storage devices and to perform I/O operations to those files.

Examples of file access storage technologies are NAS (Network Attached Storage with NFS, CIFS, HTTP, etc. file access storage protocols), MPFS (Multi-Pass File Serving file access storage protocol), intra-computer file storage, etc. The file access storage may be implemented, for example, for general purpose files, web applications, engineering applications (e.g. CAD, CAM, software development, etc.), imaging and 3D data processing, multi-media streaming, etc. The storage devices implemented in a file access network are operable with at least one file access protocol.

Object access further simplifies data access by hiding all the details about block, file and storage topology from the application. The object access occurs over API integrated in content management application. An example of object access storage technology is CAS (Content Addressed Storage).

More efficient use of storage may be achieved by data compression before it is stored. Data compression techniques are used to reduce the amount of data to be stored or transmitted in order to reduce the storage capacity and transmission time respectively. Compression may be achieved by using different compression algorithms, for instance, a standard compression algorithm, such as that described by J. Ziv and A Lempel, "A Universal Algorithm For Sequential Data Compression," IEEE Transactions on Information Theory, IT-23, pp. 337-343 (1997). It is important to perform compression transparently, meaning that the data can be used with no changes to existing applications. In either case, it is necessary to provide a corresponding decompression technique to enable the original data to be reconstructed and accessible to applications. When an update is made to a compressed data, it is generally not efficient to decompress and recompress the entire block or file, particularly when the update is to a relatively small part of data.

Various implementations of optimization of storage and access to the stored data are disclosed for example in the following patent publications:

U.S. Pat. No. 5,761,536 (Franaszek) discloses a system and method for storing variable length objects such that memory fragmentation is reduced, while avoiding the need for memory reorganization. A remainder of a variable length object may be assigned to share a fixed-size block of storage with a remainder from another variable length object (two such remainders which share a block are referred to as roommates) on a best fit or first fit basis. One remainder is stored at one end of the block, while the other remainder is stored at the other end of the block. The variable length objects which are to share a block of storage are selected from the same cohort. Thus, there is some association between the objects. This association may be that the objects are from the same page or are in some linear order spanning multiple pages, as examples. Information regarding the variable length objects of a cohort, such as whether an object has a roommate, is stored in memory.

U.S. Pat. No. 5,774,715 (Madany et al.) discloses a method, apparatus, and computer-usable medium for compressing data in a file system utilizing the concept of "holes". A mapping table in a file system maps the logical blocks of a file to actual physical blocks on a disk where the data is stored. Blocks may be arranged in units of a cluster, and the file may be compressed cluster-by-cluster. The mapping table is updated to indicate that for a given unit of data compressed, fewer physical blocks are needed. Certain logical blocks belonging to this unit of data are not mapped to physical blocks but are mapped to a hole. A hole indicates that the unit of data was compressed, and may also indicate the particular compression algorithm used to compress the unit of data.

U.S. Pat. No. 5,813,011 (Yoshida et al.) discloses a method and apparatus for storing compressed data, wherein a compressed file consists of: a header that carries information showing the position of a compression management table; compressed codes; and the compression management table that holds information showing the storage location of the compressed code of each original record.

U.S. Pat. No. 5,813,017 (Morris et al.) discloses a method and means for reducing the storage requirement in the backup subsystem and further reducing the load on the transmission bandwidth where base files are maintained on the server in a segmented compressed format. When a file is modified on the client, the file is transmitted to the server and compared with the segmented compressed base version of the file utilizing a differencing function but without decompressing the entire base file. A delta file which is the difference between the compressed base file and the modified version of the file is created and stored on a storage medium which is part of the backup subsystem.

U.S. Pat. No. 6,092,071 (Bolan et al.) discloses a system for control of compression and decompression of data based upon system aging parameters, such that compressed data becomes a system managed resource with a distinct place in the system storage hierarchy. Processor registers are backed by cache, which is backed by main storage, which is backed by decompressed disk storage, which is backed by compressed disk storage then tape, and so forth. Data is moved from decompressed to compressed form and migrated through the storage hierarchy under system control according to a data life cycle based on system aging parameters or, optionally, on demand: data is initially created and stored; the data is compressed at a later time under system control; when the data is accessed, it is decompressed on demand by segment; at some later time, the data is again compressed under system control until next reference. Large data objects are segmented and compression is applied to more infrequently used data.

U.S. Pat. No. 6,115,787 (Obara et al.) discloses a disk storage system, wherein data to be stored in the cache memory is divided into plural data blocks, each having two cache blocks in association with track blocks to which the data belongs and are compressed, thus providing the storage of plural compressed records into a cache memory of a disk storage system in an easy-to-read manner. The respective data blocks after the compression are stored in one or plural cache blocks. Information for retrieving each cache block from an in-track address for the data block is stored as part of retrieval information for the cache memory. When the respective data blocks in a record are read, the cache block storing the compressed data block is determined based on the in-track address of the data block and the retrieval information.

U.S. Pat. No. 6,349,375 (Faulkner et al.) discloses a combination of data compression and decompression with a virtual memory system. A number of computer systems are discussed, including so-called embedded systems, in which data is stored in a storage device in a compressed format. In response to a request for data by a central processing unit (CPU), the virtual memory system will first determine if the requested data is present in the portion of main memory that is accessible to the CPU, which also happens to be where decompressed data is stored. If the requested data is not present in the decompressed portion of main memory, but rather is present in a compressed format in the storage device, the data will be transferred into the decompressed portion of main memory through a demand paging operation. During the demand paging operation, the compressed data will be decompressed. Likewise, if data is paged out of the decompressed portion of main memory, and that data must be saved, it can also be compressed before storage in the storage device for compressed data.

U.S. Pat. No. 6,584,520 (Cowart et al.) discloses a method of storage and retrieval of compressed files. The method involves dynamically generating file allocation table to retrieve compressed files directly from compact disk read only memory.

U.S. Pat. No. 6,678,828 (Pham et al.) discloses a secure network file access appliance supporting the secure access and transfer of data between the file system of a client computer system and a network data store. An agent provided on the client computer system and monitored by the secure network file access appliance ensures authentication of the client computer system with respect to file system requests issued to the network data store. The secure network file access appliance is provided in the network infrastructure between the client computer system and network data store to apply qualifying access policies and selectively pass through to file system requests. The secure network file access appliance maintains an encryption key store and associates encryption keys with corresponding file system files to encrypt and decrypt file data as transferred to and read from the network data store through the secure network file access appliance.

U.S. Patent Application No. 2004/030,813 (Benveniste et al.) discloses a method and system of storing information, including storing main memory compressed information onto a memory compressed disk, where pages are stored and retrieved individually, without decompressing the main memory compressed information.

U.S. Patent Application No. 2005/021,657 (Negishi et al.) discloses a front-end server for temporarily holding an operation request for a NAS server, which is sent from a predetermined client, is interposed between the NAS server and clients on a network. This front-end server holds information concerning a correlation among data files stored in the NAS server, optimizes the operation request received from the client based on the information, and transmits the operation request to the NAS server.

SUMMARY OF THE INVENTION

There is a need in the art to provide for a new system and method of compressed storage for use with file access storage systems with substantially no derogating storing and/or retrieving capabilities and with no need of a user's awareness of compression/decompression operations as well as the storage location of the compressed data. The invention, in some of its aspects, is aimed to provide a novel solution capable of facilitating random access to data in compressed stored files and, thus, enabling operations on the compressed data with no need for decompression of entire files.

In accordance with certain aspects of the present invention, there is provided a method and system for creating, reading and writing compressed files for use with file access storage; said method and system facilitating direct access to the compressed data whilst maintaining de-fragmentation of the compressed file.

According to certain aspects of the present invention said method comprises:
    compressing a raw file and thereby generating the compressed data, wherein at least one fixed-size portion of data (cluster) of the raw file is sequentially processed into corresponding compressed section divided into at least one fixed-size compression logical unit (CLU);
    facilitating storing the compressed data as a compressed file, the compressed file containing the compressed sections corresponding to the clusters of the raw file;
    creating a section table comprising at least one record describing a compressed section, said records holding at least information on CLUs corresponding to the compressed section and storage location pointers pertaining to said CLUs.

For reading data stored in a file compressed as above, said method further comprises:
- a) determining a serial number of first compressed section comprising data to be read;
- b) determining the CLUs corresponding to said compressed section and storage location thereof by referring to the section table;
- c) restoring the cluster from said compressed section; d) if the range of data to be read exceeds the size of the restored clusters, repeating stages b) and c) for compressed sections with serial numbers incremented by 1, until all data to be read are restored.

For writing data to a file compressed as above, said method further comprises:
- a) determining a serial number of first compressed section comprising data to be updated (original section);
- b) determining the CLUs corresponding to said original compressed section and storage location thereof by referring to the section table;
- c) restoring the cluster from said original compressed section;
- d) calculating the offset of updating data within said cluster and facilitating the update of the required data range;
- e) compressing the updated cluster into an updated compressed section;
- f) facilitating overwriting said original compressed section with said updated compressed section;
- g) updating the section table
- h) if the range of data to be write exceeds the size of the restored clusters, repeating the stages from b) to g) for compressed sections with serial numbers incremented by 1, until all required data are written.

In accordance with further aspects of the present invention the method comprises handling a list of free CLUs released during writing data to the compressed file, said list being handled during all sessions related to the file until the file is closed. The method further comprises comparing the numbers of CLUs required to said original $N_o$ and updated $N_u$ compressed section and facilitating one of the following:
- overwriting all CLUs corresponding to the original compressed section with CLUs corresponding to the updated compressed section if $N_o=N_u$;
- overwriting first $N_u$ CLUs corresponding to the original compressed section with CLUs corresponding to the updated compressed section and updating the list of free CLUs about released CLUs if $N_o>N_u$;
- overwriting all CLUs corresponding to the original compressed section with CLUs corresponding to the updated compressed section and writing the rest of CLUs corresponding to the updated compressed section to the CLUs contained in the list of free CLUs, if $N_o<N_u<N_o+N_f$, where $N_f$ is a number of CLUs in said list;
- overwriting all CLUs corresponding to the original compressed section with CLUs corresponding to the updated compressed section, writing the CLUs corresponding to the updated compressed section to the CLUs contained in the list of free CLUs, and continuous writing the rest of CLUs corresponding to the updated compressed section to next free storage location if $N_o+N_f<N_u$.

In accordance with further aspects of the present invention the method further comprises checking the list of free CLUs before closing the file and, if not empty,
defining a CLU with the highest storage location pointer among CLUs comprised in the compressed sections (first CLU);
facilitating moving the compressed data from said first CLU to a free CLU with lower storage location pointer (second CLU);
assigning said second CLU to pertaining compressed section and said first CLU to the list of free CLUs;
repeating the stages b)-d) until the storage location pointers of all CLUs comprised in compressed sections are lower than a pointer of any of CLU comprising in the list of free CLUs;

According to further aspects of the present invention said system for compressing files for storage comprises:
- a subsystem for compressing a raw file and thereby generating the compressed data, wherein each fixed-size portion of data (cluster) from the raw file is sequentially processed into a compressed section divided into fixed-size compression logical units (CLU);
- a subsystem for facilitating storing the compressed data as a compressed file, the compressed file containing the compressed sections corresponding to the clusters of the raw file and a header comprising unique file descriptor;
- a subsystem for creating a section table comprising records of all compressed sections, each of said records holding information on CLUs corresponding to the compressed section and storage location pointers pertaining to said CLUs.

According to further aspects of the invention said system may constitute a part of a communication device operable in a storage network and being configured to perform compression and operations on the compressed files in accordance with the present invention.

According to further aspects of the invention said system may constitute a part of a storage device operable with at least one file access protocol and being configured to perform the compression and operations on the compressed files in accordance with the present invention.

It is to be understood that the system according to the invention may be a suitably programmed computer. Likewise, the invention contemplates a computer program being readable by a computer for executing the method of the invention. The invention further contemplates a machine-readable memory, tangibly embodying a program of instructions executable by the machine for executing the method of the invention.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

Figure 1:
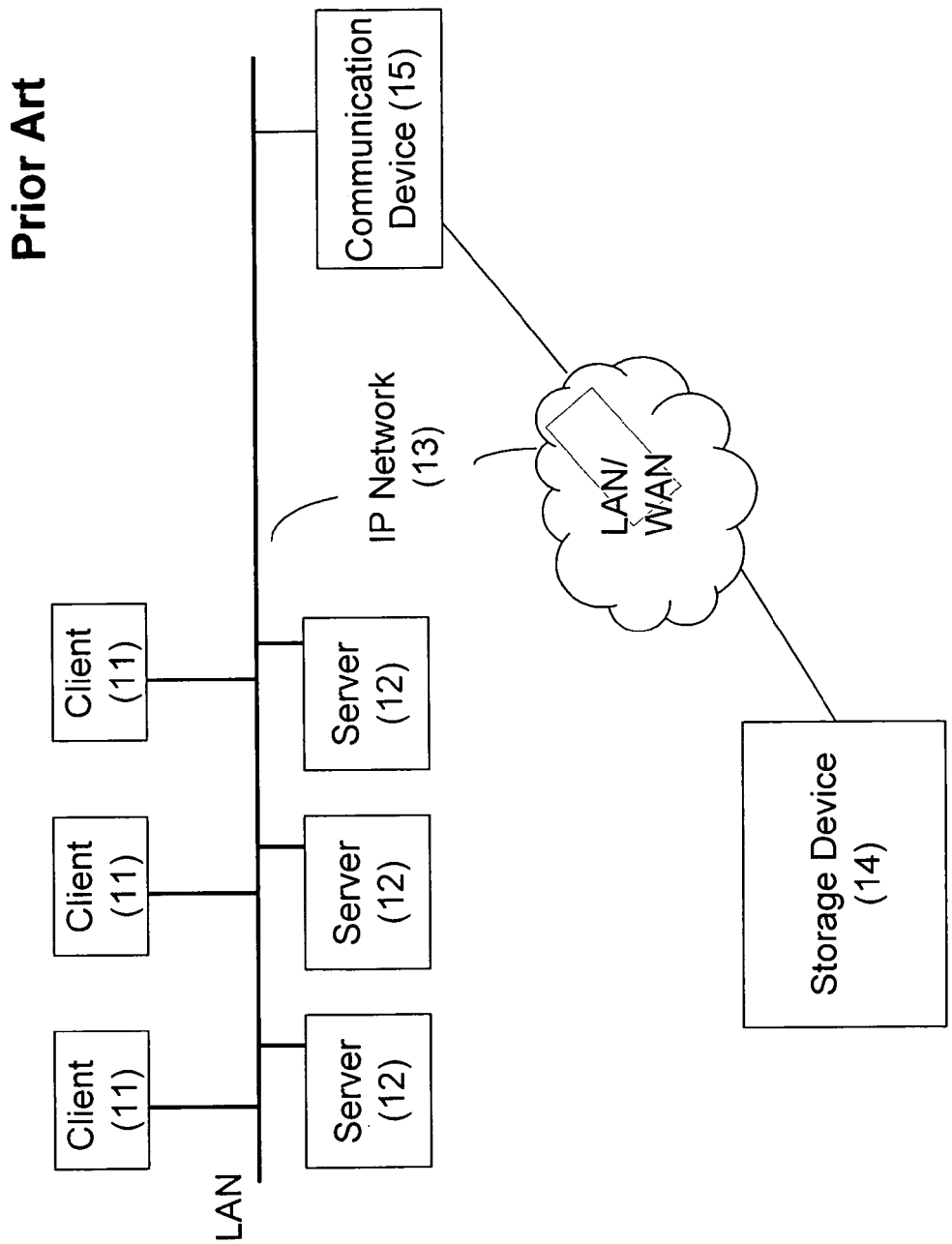
FIG. 1 is a schematic block diagram of typical NAS storage network architecture as is known in the art.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention. In the drawings and descriptions, identical reference numerals indicate those components that are common to different embodiments or configurations.

Unless specifically stated otherwise, as apparent from the following discussions, it is appreciated that throughout the specification discussions, utilizing terms such as "processing", "computing", "calculating", "determining", or the like, refer to the action and/or processes of a computer or computing system, or processor or similar electronic computing device, that manipulate and/or transform data represented as physical, such as electronic, quantities within the computing system's registers and/or memories into other data, similarly represented as physical quantities within the computing system's memories, registers or other such information storage, transmission or display devices.

Embodiments of the present invention may use terms such as processor, computer, apparatus, system, sub-system, module, unit, device (in single or plural form) for performing the operations herein. This may be specially constructed for the desired purposes, or it may comprise a general purpose computer selectively activated or reconfigured by a computer program stored in the computer. Such a computer program may be stored in a computer readable storage medium, such as, but not limited to, any type of disk including, optical disks, CD-ROMs, magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a computer system bus.

The term "file record" used in this patent specification includes any set of file attributes associated with the file, said set constituting a part of a file system (e.g. a part of internal table in the file system, etc.). The attributes may include file identifier, timestamps, file size, etc.

The processes/devices (or counterpart terms specified above) and displays presented herein are not inherently related to any particular computer or other apparatus, unless specifically stated otherwise. Various general purpose systems may be used with programs in accordance with the teachings herein, or it may prove convenient to construct a more specialized apparatus to perform the desired method. The desired structure for a variety of these systems will appear in the description below. In addition, embodiments of the present invention are not described with reference to any particular programming language. It will be appreciated that a variety of programming languages may be used to implement the teachings of the inventions as described herein.

Bearing this in mind, attention is drawn to FIG. 1 illustrating a schematic diagram of typical NAS storage network architecture as is known in the art. The files from clients 11 and/or servers 12 are transferred via IP network 13 to file storage device(s) 14. The file storage devices may be specialized NAS file servers, general purpose file servers, SAN storage, stream storage device, etc. The IP network may be a local area network (LAN), wide area network (WAN), their combination, etc. The IP network comprises one or more communication devices 15 (e.g. switch, router, bridge, etc.) facilitating the data transferring.

Figure 2A:
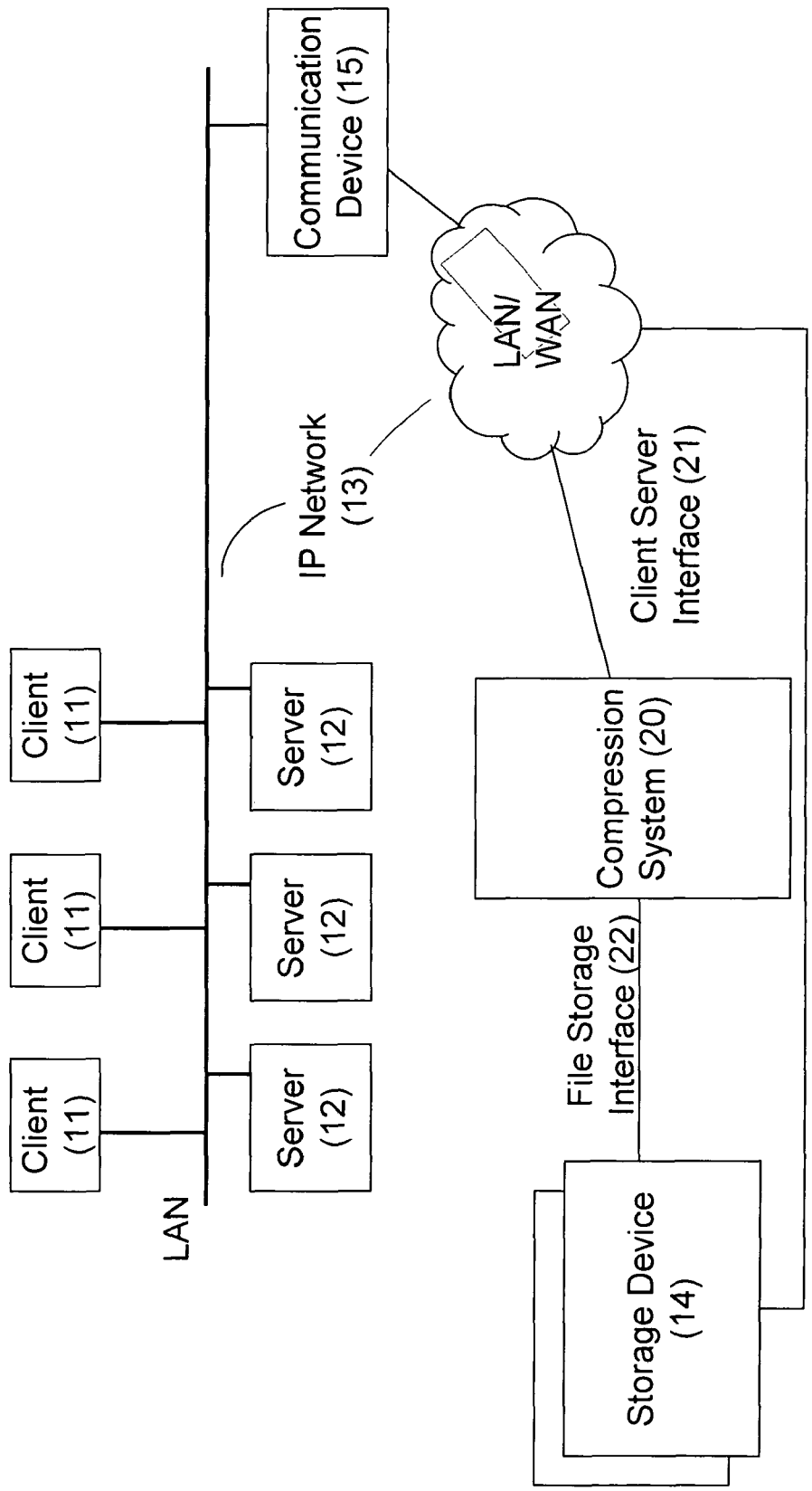
FIGS. 2a)-2d) are schematic block diagrams of NAS storage network architecture in accordance with certain embodiments of the present invention.

Referring to FIG. 2a, there is illustrated, by way of non-limiting example, a schematic diagram of NAS storage network architecture in accordance with certain embodiments of the present invention. The communication between the servers 12 and/or the clients 11 with the file storage device 14 passes through a compression system 20. The compression system 20 comprises client/server interface 21 connecting one or more client/servers and file storage interface 22 for bridge/proxy connection with one or more file storage devices. The compression system 20 is configured to intercept file call operations (file access-related requests) and to act as a proxy on certain transactions (e.g. keeping the throughput on control transactions and proxy on data transactions). The compression system 20 may support any physical interfaces (e.g. Ethernet, Fiber Channel, etc.) and may preserve the storage device features such as, for example, redundancy, mirroring, snapshots, failover, rollback, management, etc. The compression system may be seamlessly integrated with existing network infrastructure. For implementing the compression and access functions described below, typically, the compression system does not require changes in any level above the file itself A user need not be aware of the compression and decompression operations and the storage location of compressed data.

The compression system 20 is capable of deriving and compressing data corresponding to the intercepted file access-related request, facilitating communication with and/or within the file system for storing the compressed data at the storage medium as at least one compressed file and/or facilitating restoring at least part of compressed data corresponding to the intercepted file request. During "write" operation on the files to be compressed for storage, the compression system 20 receives from the clients 11 and/or the servers 12 through the network 13 data corresponding to said files, compresses them and facilitates writing at the file storage device 14. A "read" operation proceeds in reverse direction; the required files are retrieved by the compression system, decompressed (partly or entirely, in accordance with required data range) and sent to the appropriate client/server. The compression/decompression operations in accordance with certain aspects of the present invention are further described with reference to FIGS. 3-11 below.

Figure 2B:
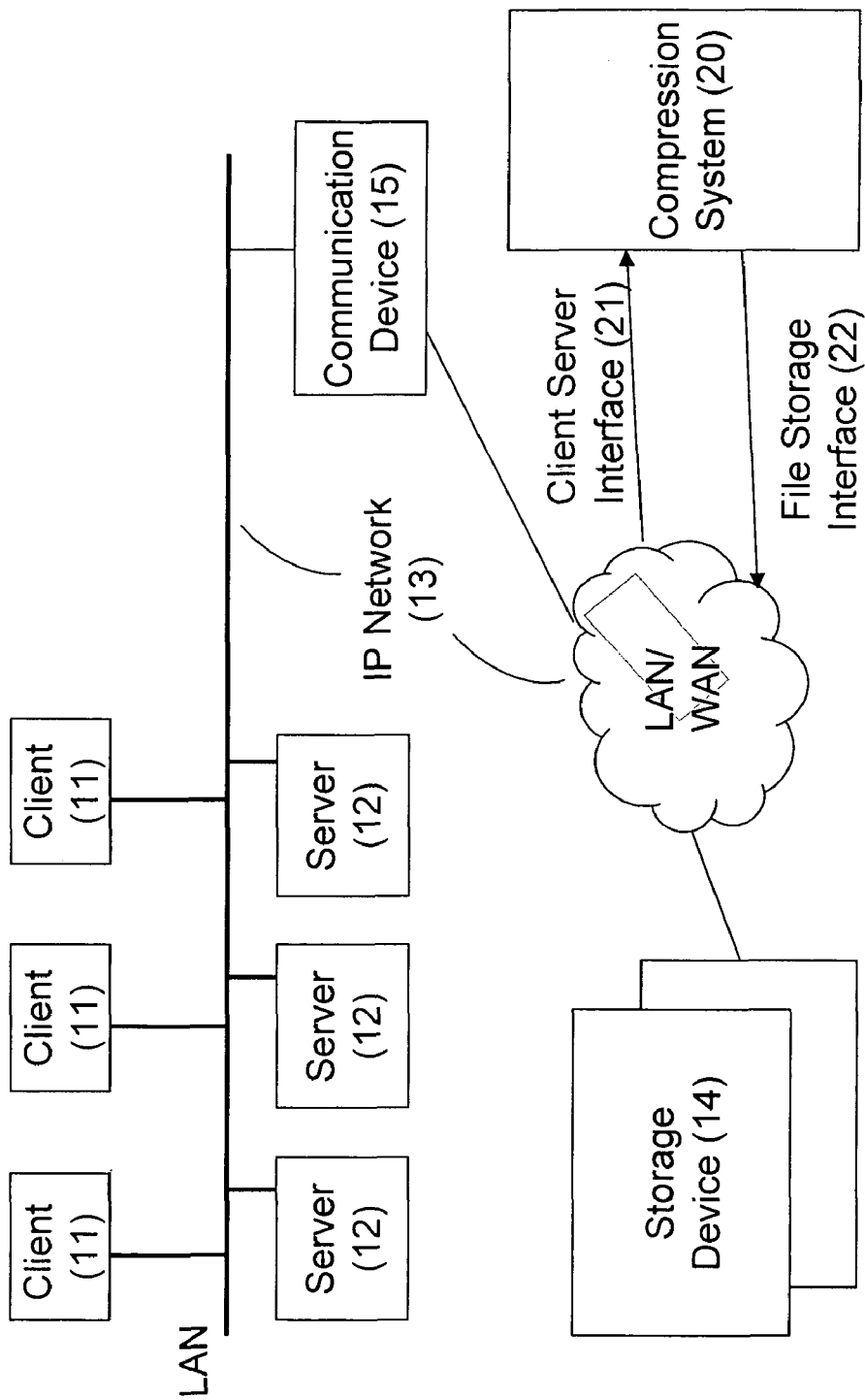

FIG. 2b illustrates, by way of non-limiting example, NAS storage network architecture for another embodiment of the present invention when the files (or respective parts of them)

received from the client/servers are compressed by the compression system before transferring to the storage device 14 via the network 13.

Figure 2C:
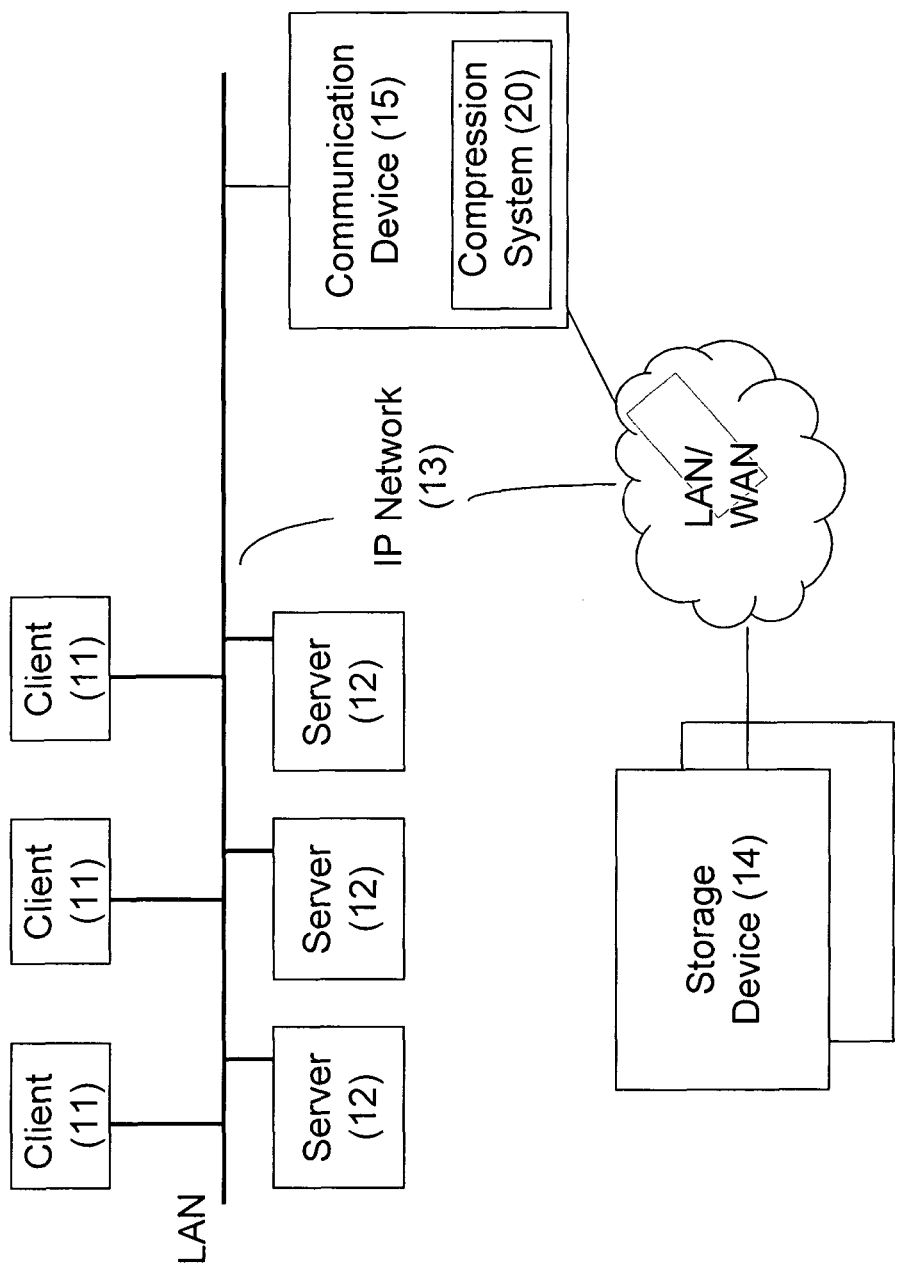

FIG. 2c illustrates, by way of non-limiting example, NAS storage network architecture for another embodiment of the present invention when the compression system 20 is integrated with at least one communication device 15. The integration may be provided in different ways. For example, the compression system 20 may be integrated in the communication device "inter alias", the functionality of the compression system may be implemented in a specialized board, distributed (fully or partly) between other modules of the device, etc.

Figure 2D:
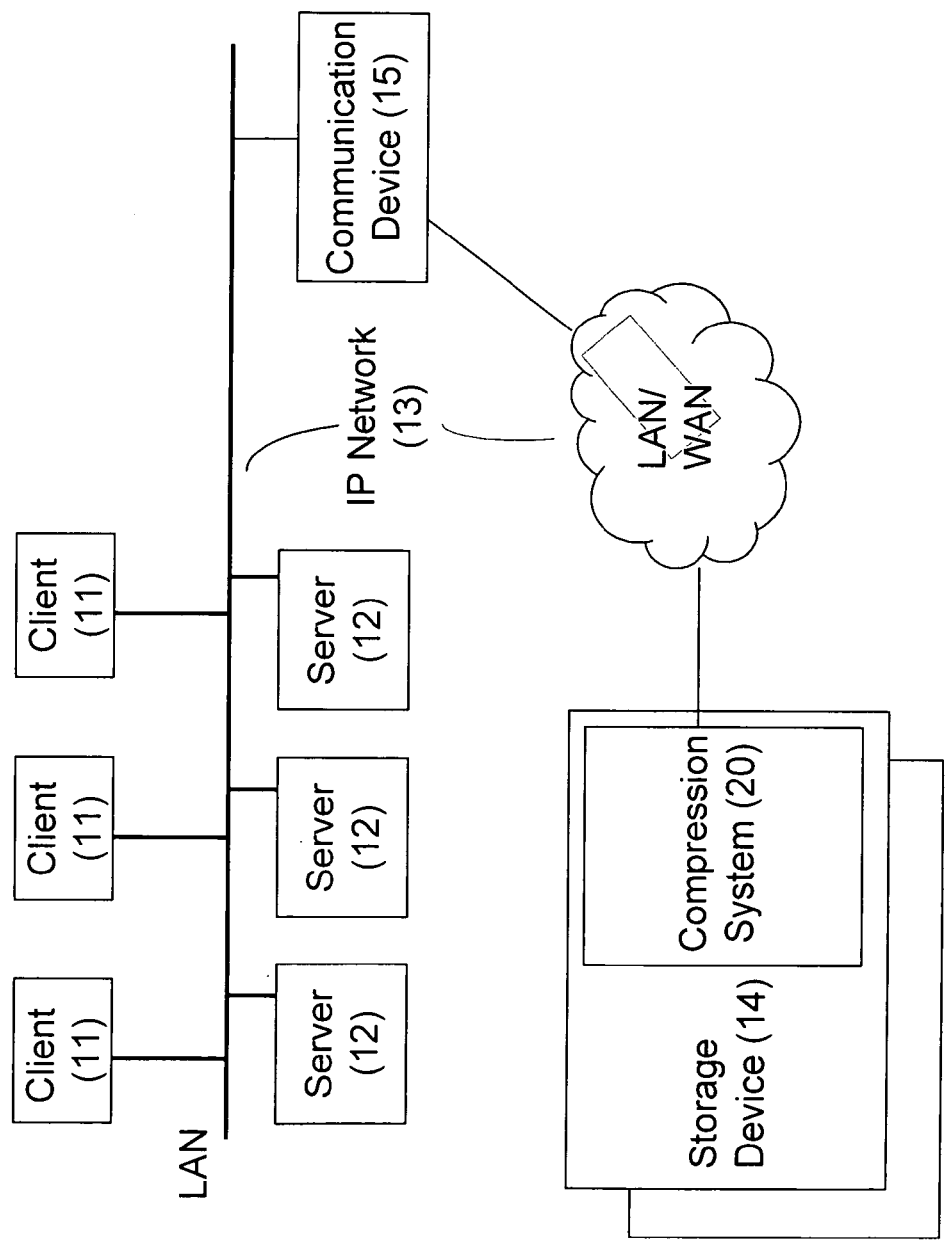

FIG. 2d illustrates, by way of non-limiting example, NAS storage network architecture for another embodiment of the present invention when the compression system 20 is integrated with at least one storage device 14. The integration may be provided in different ways. For example, the compression system 20 may be integrated in the storage device "inter alias", the functionality of the compression system may be implemented in a specialized board, distributed (fully or partly) between other modules of the device, etc. In certain embodiments of the present invention such integration may comprise modification of the file system in the storage device 14 as will be further detailed with reference to FIG. 3b and FIGS. 4-11 below.

In accordance with certain embodiments, the compression system 20 may provide also security functions as, for example, encryption, authentication, etc.

In certain embodiments of the invention the compression system 20 is configured to transfer certain transactions (typically, control related transactions, e.g. copy file, delete file, rename file, take a snapshot, etc.) between clients/servers and the file storage device in a transparent manner, while intervening in file access-related related transactions (e.g. open, close, read, write, create, etc.) and some control related transactions as, for example, directory list command.

In certain embodiments of the invention the compression system may be configured to compress also uncompressed files stored at the storage device 14 (e.g. with no passing through the compression system 20). The compression system may extract all or certain files from the storage device in accordance with pre-defined criteria, compress them in accordance with certain embodiments of the present invention and re-write in the storage device in a compressed form.

In certain embodiments of the invention the compression system 20 may also be configured to compress only certain passing files in accordance with pre-defined criteria (e.g. size, IP address, directory, file type).

The raw file (or its relevant part) is compressed by the compression system 20 during or before writing to the file storage device 14. Similarly, the file (or its relevant part) is decompressed by the compression system 20 during or after reading from the file storage device 14. In certain embodiments of the invention the files may be transferred between the compression system 20 and the storage device 14 in a compressed manner; for example, a raw file may be compressed and written within the compression system and the resulting compressed file may be further transferred to the file storage device and/or compressed file may be received from the storage device for further read/write operations within the compression system.

Note that the invention is not bound by the specific network architecture described with reference to FIGS. 1 and 2a-2d. Those versed in the art will readily appreciate that the invention is, likewise, applicable to any network including NAS or other based on file-access storage sub-network with IP or channel-based communication. The functions of the compression system 20 (or part of them) may be implemented in a stand-alone server(s) (e.g. as illustrated in FIGS. 2a-2b), distributed between several compression systems and/or integrated within other storage network elements, for example file servers, enterprise and network switches, routers, storage devices, etc. (e.g. as illustrated in FIGS. 2c-2d). The integration may be provided in different manner and implemented in software and/or firmware and/or hardware.

Figure 3A:
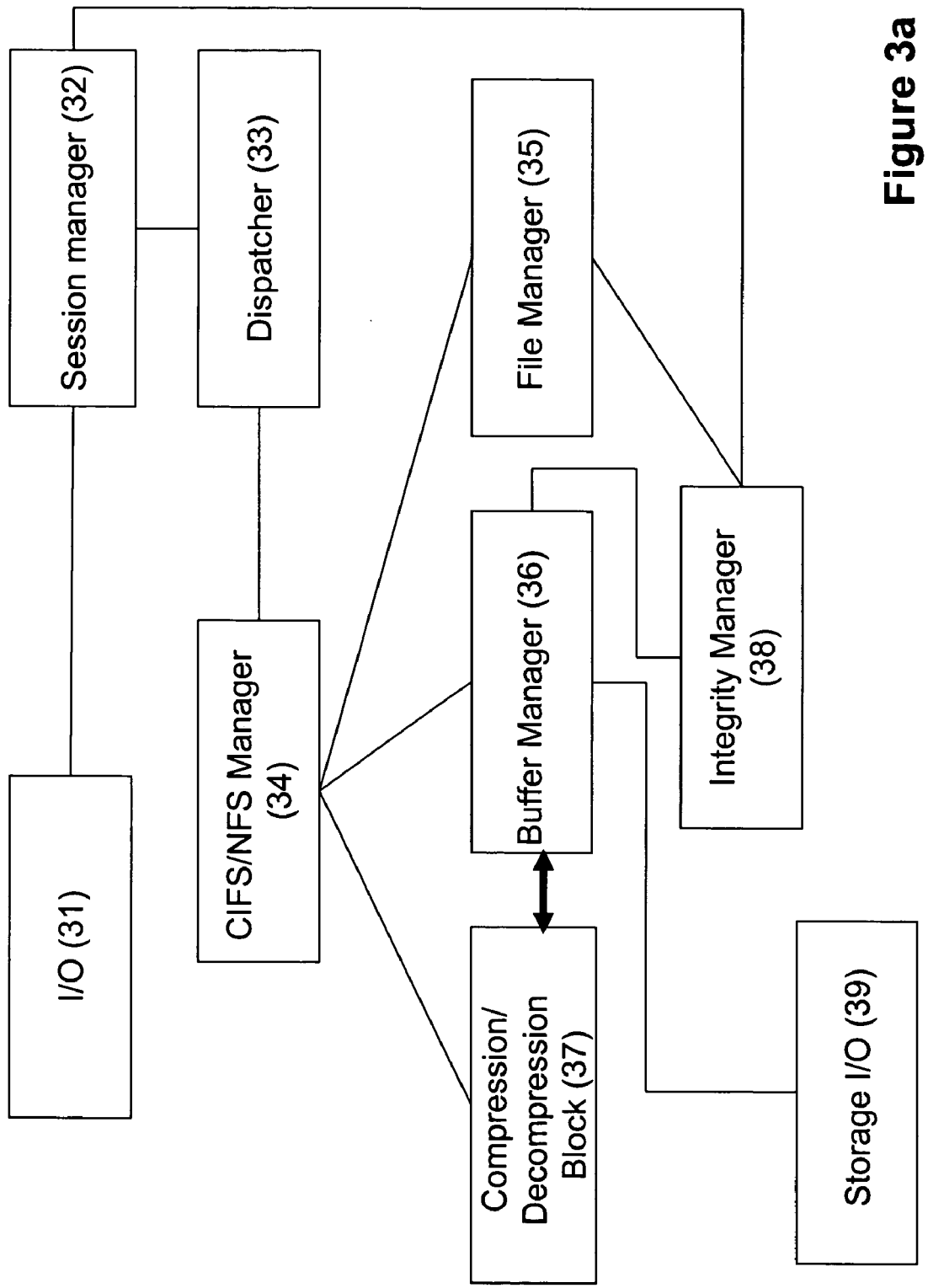
FIGS. 3a) and 3b) are schematic block diagrams of the system functional architecture in accordance with certain embodiments of the present invention.

FIG. 3a illustrates, by way of non-limiting example, a schematic functional block diagram of the compression system 20 in accordance with certain embodiments of the present invention.

The Input/Output block 31 is responsible for socket handling. The block 31 receives new TCP packets, unpacks them and moves to a session manager 32; the block also gets data from the session manager, packs it in TCP structure and sends it to the requested address.

A session starts by "Open File" request and ends by "Close File" request received from the same IP address (user). The session manager 32 holds all the session's private data as, for example, source IP address, all files instance in use, session counters, session status, all instances for the buffers in use, etc. The session manager also handles the "File Block" and releases all the relevant resources on disconnect. The session manager 32 loads session tasks to the dispatcher 33 for filtering the received packets. The dispatcher sends CIFS/NFS packets to a CIFS/NFS manager 34 and forwards all other packets back to the I/O block 31 (via the session manager) with no touch. The CIFS/NFS manager 34 integrates accordingly CIFS and NFS transactions and requests a file manager 35 for data related transactions (e.g. Open, Read, Write, Close, etc.) and a compression/decompression block 37 for compression/decompression operations in accordance with certain embodiments of the present invention. Generally, compression algorithms have several compression levels characterized by trade-off between compression efficiency and performance parameters. The compression block 37 may select the optimal compression level and adjust the compression ratio to number of sockets currently handling by input/output block 31 (and/or CPU utilization). The information about selected (and/or achieved) compression level is kept in the compressed portion of data. The file manager 35 is responsible for the integrity and operations on the file. It also combines all requests related to the file to enable sharing the file manipulation. Memory buffer resources are managed by a buffer manager 36 operatively connected with the CIFS/NFS manager. The buffer manager is operatively coupled with the compression/decompression block 37. The compression/decompression block is capable of reading and decompressing data from the memory buffer resources as well as of compressing and writing the data. Integrity manager 38 is operatively connected with the session manager, the buffer manager and the file manager and responsible for synchronization and general control of all processes in the compression system. The storage I/O block 39 is operatively connected with the buffer manager and interfacing between the compression system 20 and the storage device.

Figure 3B:
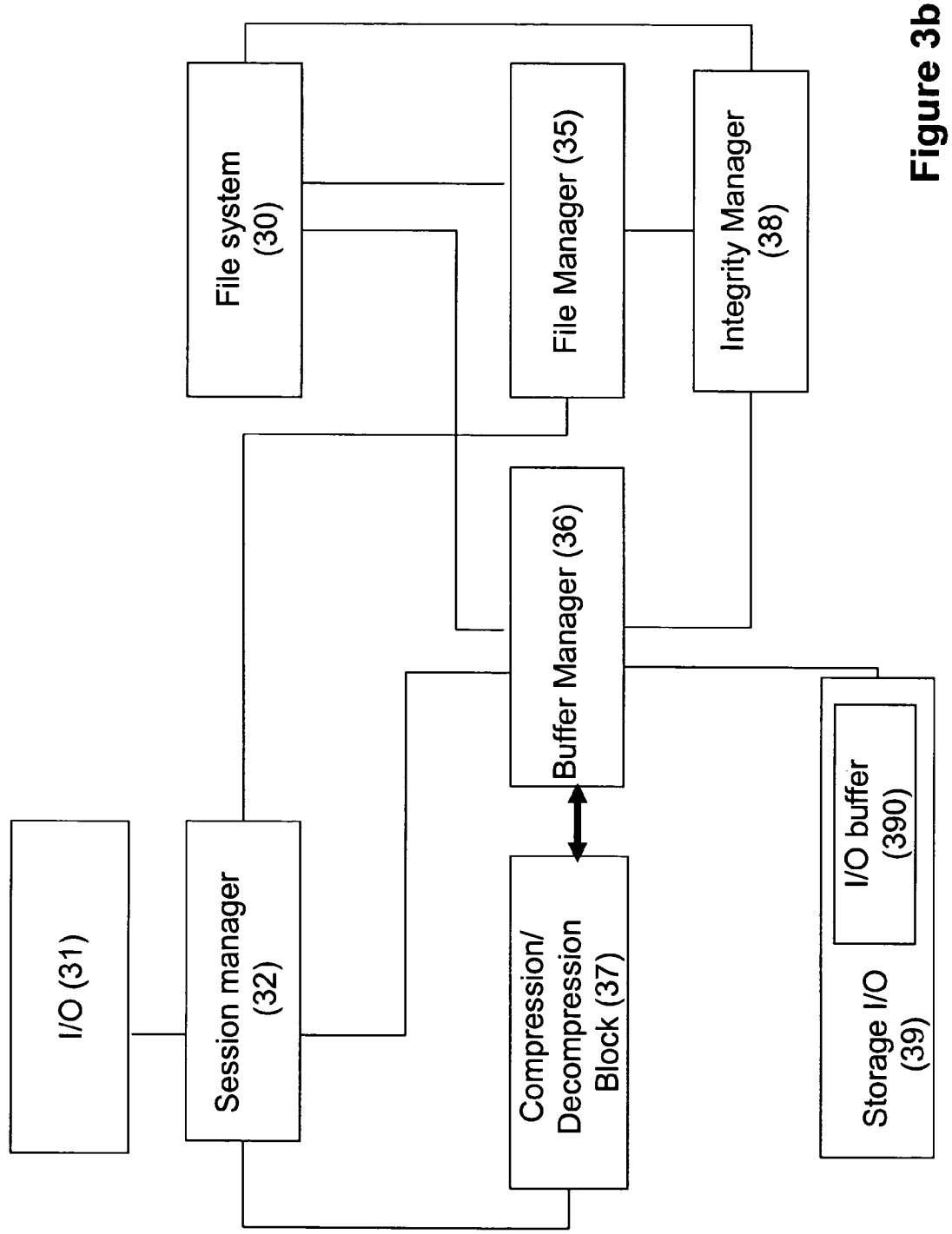

FIG. 3b illustrates, by way of non-limiting example, a schematic functional block diagram of implementation the compression/decompression functionalities in accordance with certain embodiments of the present invention in the storage device 14. Illustrated in the embodiment compression/decompression functionalities may be implemented in the same resources as the file system (e.g. in the same CPU).

In a manner similar to the embodiment illustrated in FIG. 3a, the Input/Output block 31 is responsible for socket handling. The block 31 receives new TCP packets, unpacks them and moves to a session manager 32; the block also gets data from the session manager, packs it in TCP structure and sends to the requested address. The session manager 32 is operatively coupled to the file manager 35, the buffer manager 36 and compression/decompression block 37 and communicates with them with regards to corresponding session related tasks. The session manager holds all the session's private data, handles the "File Block" and releases all the relevant resources on disconnect. The session manager passes file access-related requests to the file manager 35. In accordance with the received request, the file manager communicates with a file system 30 to get and update information with regards to the requested file. The file system is responsible for managing the space of the storage media and may be any of existing file systems, variants or evolution thereof as well as a file system modified in accordance with the present invention as will be further detailed with reference to FIGS. 4-11. The file manager 35 is responsible for the integrity and operations on a file. It also combines all requests related to the file to enable sharing the file manipulation. The file system is also operatively coupled with the buffer manager 36 managing memory buffer resources. The buffer manager is operatively coupled with the compression/decompression block. The compression/decompression block 37 is capable of reading and decompressing data from the memory buffer resources as well as of compressing and writing the data to the buffer. Integrity manager 38 is connected with the session manager, the buffer manager and the file manager and responsible for synchronization and general control of all processes in the compression system. The storage I/O block 39 is connected with the buffer manager and is responsible for physical read/write operations on the disk. In a typical storage device, a size of data handled during each physical I/O operations corresponds to a size of disk sectors (e.g. 512 kB), which may be not enough to achieve desired compression ratio. Accordingly, in certain embodiments of the present invention the storage I/O block comprises a special I/O buffer 390 managed by the buffer manager and facilitating effective "on-the fly" compression/decompression. The size of the I/O buffer is defined by the portions of data to be compressed/decompressed. In accordance with certain embodiments of the present invention the size of the buffer is equal to the size of clusters detailed with reference to FIG. 4.

Those skilled in the art will readily appreciate that the invention is not bound by the configuration of FIGS. 3a and 3b; equivalent and/or modified functionality may be consolidated or divided in another manner.

Figure 4:
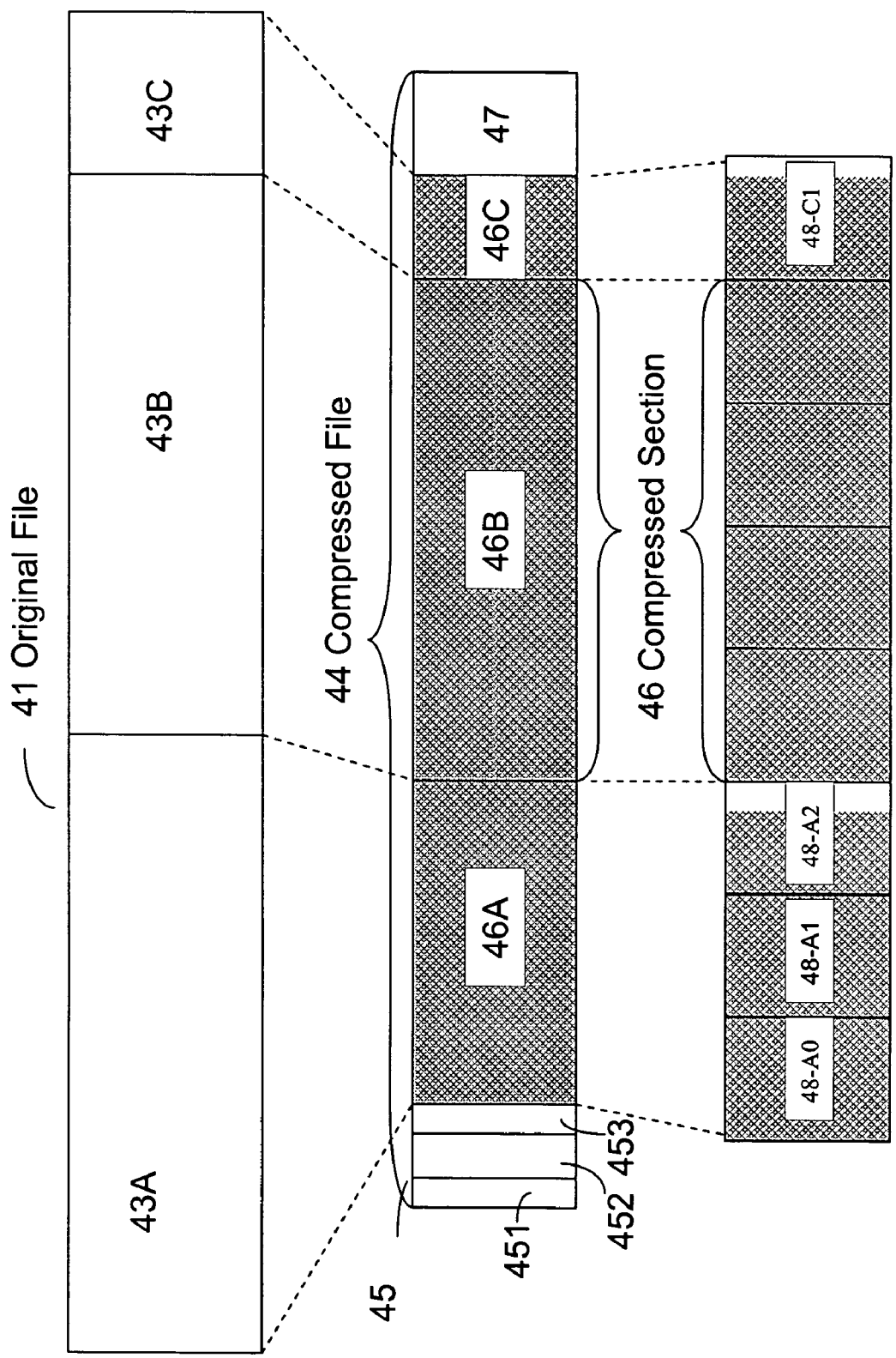
FIG. 4 is a schematic diagram of raw and compressed files in accordance with certain embodiments of the present invention.

FIG. 4 illustrates a schematic diagram of raw and compressed files in accordance with certain embodiments of the present invention. The uncompressed raw file 41 is segmented into portions of data 43 with substantially equal predefined size (hereinafter referred to as clusters). These clusters serve as atomic elements of compression/decompression operations during input/output transactions on the files. The segmentation of the raw file into clusters may be provided "on-the-fly" during the compression process, wherein each next portion 43 with a predefined size constitutes a cluster that is subjected to compression. In certain other embodiments of the invention, the segmentation may be provided before compression. The size of the last portion of the raw file may be equal or less than the predefined size of the cluster; in both cases this portion is handled as if it has a size of a complete cluster. The size of the clusters may be configurable; larger clusters provide lower processing overhead and higher compression ratio, while smaller clusters provide more efficient access but higher processing overhead. Also, the size of a cluster depends on available memory and required performance, as compression/decompression process of each file session requires at least one cluster available in the memory while performance defines a number of simultaneous sessions. The number of clusters is equal to the integer of (size of the raw file divided by the size of cluster) and plus one if there is a remainder.

Alternatively, in certain other embodiments of the invention, the size of cluster may vary in accordance with pre-defined criteria depending, for example, on type of data (e.g. text, image, voice, combined, etc.). For example, each type of data may have predefined size of cluster and the compression system during compression may select the appropriate size of cluster in accordance with data type dominating in the compressed portion of the raw file. being compressed.

Each intra-file cluster 43 (e.g. 43A-43C as illustrated in FIG. 4) is compressed into respective compressed section 46 (e.g. 46A-46C as illustrated in FIG. 4). The clusters with the same size may naturally result in compressed sections with different size, depending on the nature of data in each cluster and compression algorithms. If a ratio of a cluster compression is less than a pre-defined value, the corresponding compressed section in the compressed file may comprise uncompressed data from this cluster. For instance, if the raw data in a given cluster is compressed to no less than X % (say 95%) of the original cluster size, then due to the negligible compression ratio, the corresponding section would accommodate the raw cluster data instead of the compressed data.

In certain embodiments of the invention, the compression process may include adaptive capabilities, providing optimal compression algorithm for each cluster in accordance with its content (e.g. different compression algorithms best suited for clusters with dominating voice, text, image, etc. data).

In accordance with certain embodiments of the present invention each compressed file 44 comprises a header 45, several compressed sections 46 and a section table 47. The header 45 of the compressed file comprises unique file descriptor 451, the information 452 about the size of the raw file 41 and a signature 453 indicating whether the file was processed by the compression system 20 (also for files which were not compressed by the compression system, e.g., because of obtainable compression ratio less than a predefined value).

Note that in said embodiments the compression system 20 may also intervene in commands referring to a size of a raw file (e.g. DIR, STAT, etc.) keeping the size in the header of correspondent compressed file and providing said data upon request. Thus, for example, consider a file having file size X (in its raw form) and Y (<X) in its compressed form (as stored in the disk). In accordance with the specified characteristics, the file size stored in the header would be X (raw file size) maintaining thus full transparency insofar as system commands such as DIR, STAT are concerned.

In other embodiments of the present invention (e.g. in certain embodiments when compressed/decompressed functionalities are integrated with the storage device, etc.) the header 45 or any of its parts and combinations thereof may constitute a part of the file system. A file identifier used in a certain file system (e.g. node ID) may be used as the unique file descriptor 451 of the compressed file. In certain embodiments of the invention a file record in the file system may be modified and comprise an additional field for information 452 about the size of the raw file. In certain embodiments of the present invention another additional field may comprise said signature 453.

Note that the embodiment of the present invention wherein the file system comprises information about the sizes of the raw and the compressed file may provide additional benefits. For example, configurable setting quota limits on users in accordance with uncompressed (virtual) and/or compressed (physical) sizes of data, setting the locking address in accordance with the uncompressed size of file, etc. File locking is an operation that enforces access to a file or portion thereof by only permitted user(s) or process(es) at any specific time. The data to be locked are defined by File ID, start lock offset and a length of the requested file portion to be locked. Generally, there are three sub-operations in the "lock file" operation: lock verification, setting a lock and unlocking. Lock verification is successful if the requested file portion is not locked already and the offset of the end of the requested portion is located within the file. The nature of compressed files (when the physically stored file may be less than the virtual file operable by the user) may lead to false positive lock verification. In accordance with certain embodiments of the present invention, the lock verification and, accordingly, the entire locking operation for compressed files shall be provided in reference to the uncompressed (virtual) size of the file.

The number of compressed sections within the compressed file is equal to the number of clusters. In accordance with certain embodiments of the present invention, the data in the compressed sections 46 are stored in compression logical units (CLU) 48 all having equal predefined size (e.g., as illustrated in FIG. 4, compression logical units 48A0-48A2 correspond to the compressed section 46A which corresponds to the cluster 43A). This predefined CLU size is configurable; larger CLUs provide lower overhead, while smaller CLUs lead to higher resolution. Also, in certain embodiments of the invention, the CLU size may be adjusted to the maximum and/or optimal CIFS/NFS packet length.

The number of CLUs within a compressed section is equal to the integer of (size of the compressed section divided by the size of CLU) and plus one if there is a remainder. The last CLU in compressed section may be partly full (as, e.g. 48-A2, 48-C1 in FIG. 4). Such CLUs may be handled in the same manner as full CLUs. In certain embodiments of the invention, the last CLU in the last compressed section (as, e.g., illustrated by 48-C1 in FIG. 4) may be handled in a special manner; namely, to be cut to the exact compression size if partly full (further described with reference to FIG. 9 below).

CLUs may be considered as a virtual portion of the compressed file formed by a virtual sequence of segments in the memory. The relationship between CLUs and assigned memory segments is further described with reference to FIG. 11 below.

The section table 47 comprises records of all compressed sections 46 and specifies where to find CLUs corresponding to each of the compressed sections. The record in respect of each compressed section (hereinafter section record) comprises a signature indicating if the section was compressed, overall size of the compressed section and a list of pointers pertaining to all CLUs contained in the section. Optionally the record may comprise indication of compressed algorithm used during compression of the corresponding cluster and size of cluster (if variable per predefined criteria). In certain embodiments of the present invention the section table 47 constitutes a part of the compressed file and, preferably, placed at the end of the compressed file as its length may change when the content of the file is updated (as will be further illustrated with reference to FIG. 5), the length of section table is proportional to a number of compressed sections and, accordingly, number of clusters).

Alternatively, in other embodiments of the present invention (e.g. in certain embodiments when compressed/decompressed functionalities are integrated with the storage device, etc.) the section table 47 constitutes a part of the file system.

Figure 5:
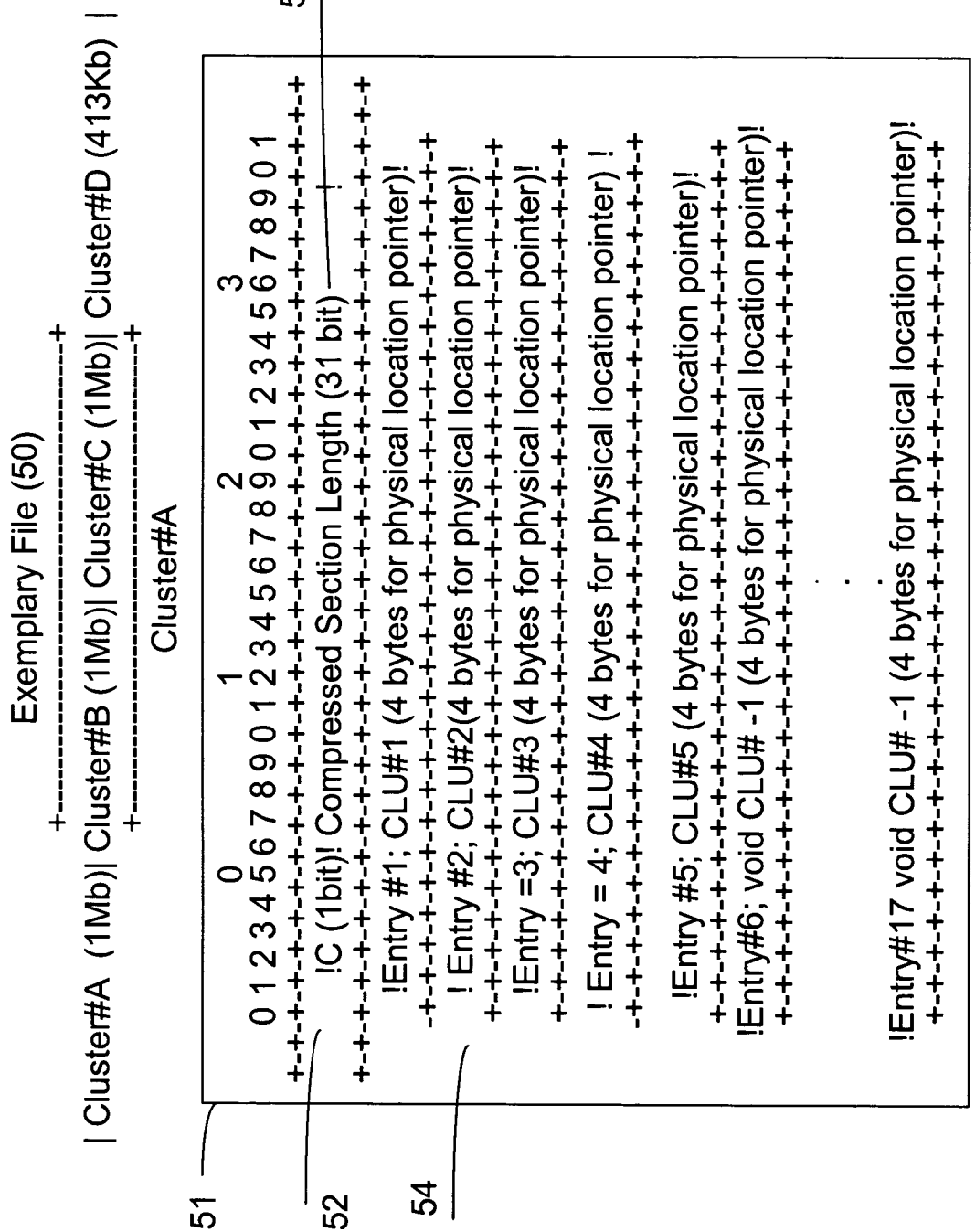
FIG. 5 is an exemplary structure of a section table in accordance with certain embodiments of the present invention.

FIG. 5 illustrates, by way of non-limiting example, an exemplary structure of a section table of an exemplary file.

This exemplary file 50 (referred to also in further examples) has original size 3 MB+413 bit, predefined cluster size 1M and CLU size 60K. Accordingly, the raw file contains 4 clusters (3 clusters of 1 MB and one which is partly full, but handled as complete cluster).

A record 51 of a compressed section comprises a signature 52, size of the section 53 and several entries 54. Each entry 54 of the section record comprises information about one of CLUs contained in the compressed section. The section table comprises relation between the physical location and the logical CLU #.

The clusters of the exemplary file 50 are compressed into compressed sections with respective sizes of, e.g., 301123, 432111, 120423 and 10342 bytes. As CLU length of 60K means 61440 bytes, the section #0 has 5 allocated CLUs ([301123/61440]+1); section #1 has 8 allocated CLUs ([432111/61440]+1); section #2 has 2 allocated CLUs ([120423/61440]+1) and section #3 has 1 allocated CLU ([10342/61440]+1). Totally, the compressed file will comprise 16 CLUs (with total size 15*61440 bytes+10342 bytes), fixed length header (e.g. 24 bytes including 4 byte for the signature, 16 byte for the file ID (unique descriptor) and 4 byte for the info about original size), and section table with 4 section records.

If the exemplary file 50 was created as a new compressed file, the CLUs will be allocated sequentially, for example, First 5 CLUs with pointers 1, 2, 3, 4, 5 will be allocated to Section 0;

Next 8 CLUs with pointers 6, 7, 8, 9, 10, 11, 12, 13 will be allocated to Section 1;

Next 2 CLUs with pointers 14, 15 will be allocated to Section 2;

Next 1 CLUs with pointer 16 will be allocated to Section 3.

The distribution of CLUs within the file may be changed after an update (as will be further described with a reference to FIGS. 8-11 below). For example, CLUs with pointers 1, 4, 5, 6, 9 will be allocated to Section 0;

CLUs with pointers 2, 3, 7, 10, 11, 12, 15, 14 will be allocated to Section 1;

CLUs with pointers 8, 13 will be allocated to Section 2;

CLUs with pointer 16 will be allocated to Section 3.

(In the current example the updates had no impact on the size of the compressed sections).

When a file is created as a new compressed file, the virtual (logical) sequence of CLUs is the same as physical sequence of disk segments corresponding to the CLUs. In an updated file, virtual (logical) sequence of CLUs may differ from the physical sequence of disk segments corresponding to the CLUs. For instance in the example above, the second CLU of the first cluster was initially located at a physical segment #2 wherein after the update it is located at the physical segment # 4. Each CLU is assigned to a segment in a memory, the correspondent segment is written in the offset of the header 45 length plus CLU's length multiplied by the segment serial number. For example, in the exemplary file above, when the second CLU of the first cluster is located at the physical segment #2, it is written in the storage location memory in the offset 24 bytes of the header plus 2*61440 bytes. When after an update this CLU is located at the physical segment #4, its offset becomes 24 bytes of the header plus 4*61440 bytes.

In certain embodiments of the invention, the number of entries in each section record is constant and corresponds to the maximal number of CLUs which may be required for storing the cluster.

Accordingly the size of each section record is constant regardless of the actual number of CLUs comprised in the section; not in use entries may have special marks. The number of entries in the section records is equal to integer of size of cluster divided by the size of CLU plus one.

In the illustrated example with clusters predefined size 1 MB and CLU's predefined size 60 K, each record of compressed section has 17 entries (integer of 1 MB/60K plus one) each one having 4 bytes. Respectively, the illustrated section record 50 of the compressed section #0 has 5 entries containing information about physical location of the correspondent CLUs and 12 empty entries (marked, e.g. as −1). The size of section record is 72 bytes (4 bytes for info on the compressed section size and signature plus 17 entries*4 bytes). The overall size of the section table is 288 bytes (4 compressed sections*72 bytes for each section record).

In certain embodiments of the invention, the compressed data may be stored separately from the section table 47. The section tables may be stored in the separate files within the same storage space as the compressed data or at different, potentially physically remote, storage space, e.g. on the compression system 20. In certain embodiments of the invention the section table may constitute a part of the file system of the storage device. The compression system 20 shall be configured in a manner facilitating maintenance of association between the compressed data and the corresponding section tables during read/write operations.

FIGS. 6-11 illustrate input/output operations performed on compressed file in accordance with certain embodiments of the present invention. The following description refers to embodiments of the current invention illustrated in FIGS. 2a-2b. Those versed in the art will readily appreciate that the invention is, likewise, applicable to other embodiments and may be practiced in a similar manner (e.g. for embodiments illustrated in FIGS. 2c-2d).

Upon receiving an inbound request to open a specific file compressed in accordance with certain embodiments of the present invention (a user may be not aware that the file is compressed), the compression system 20 transfers the request to the NAS system (storage device 14) and receives a "Handle" reply serving as a key for the file management (or "Null" if the file not found). Following the received "Handle", the compression system 20 reads the header 45 comprising the file ID (unique file descriptor) and the size of corresponding raw file. Per the file ID the compression system 20 checks if there is a concurrent session related to the file. If "No", the compression system generates a File Block comprising a unique file descriptor and the size of raw file. If the file is already in use, the compression system adds additional session to the existing File Block. The "Handle" then is returned to a user to be sent to the compression system with the following requests on file operations.

Open file operation also includes reading the section table 47 of the compressed file and obtaining information of all CLUs corresponding to the file. From the moment the file is opened and until it is closed, the compression system is aware of CLUs structure of the file and offset of any byte within the file.

Figure 6:
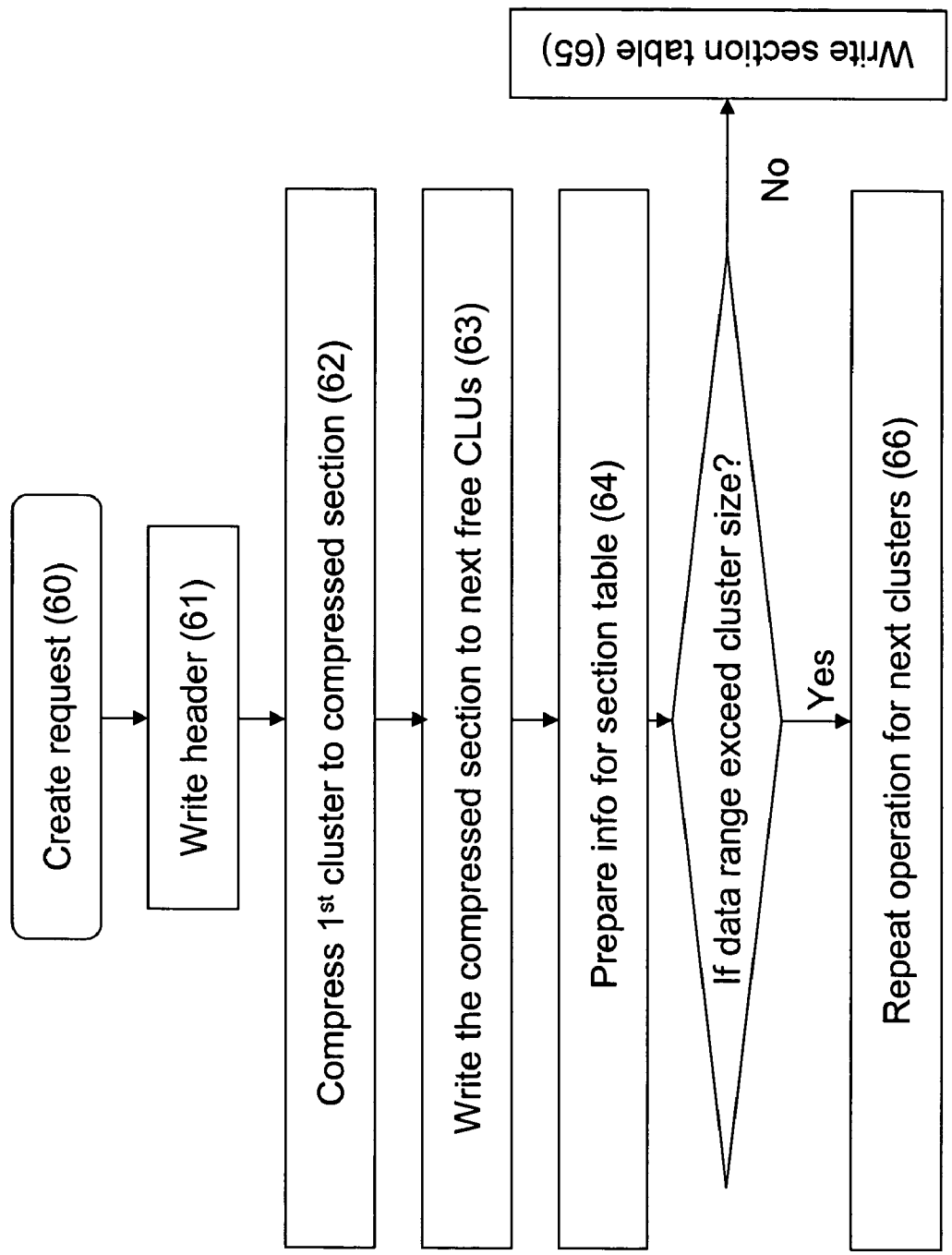
FIG. 6 is a generalized flowchart of operation of compressed file creation in accordance with certain embodiments of the present invention.

Referring to FIG. 6, there is illustrated a generalized flowchart of compressed file creation in accordance with certain embodiments of the present invention. The process is initiated by an inbound create request. The compression system 20 generates 60 outbound request to the file storage device 14; and after confirmation, starts writing 61 a header of the compressed file at the file storage device. As described in FIG. 4, the header will include a file descriptor, a size of the raw uncompressed file and a signature indicating that the file was processed by the compression system 20. At the next step 62 the compression system processes the first fixed-size portion (cluster) of the raw file into compressed section having size X. (The compression may be provided with the help of any appropriate commercial or specialized algorithm). The compression system defines first free storage location for the first CLU, starts and handles continuous writing 63 of the compressed section in this and sequential CLUs for storing at the file storage device, and prepares 64 the pointers of the CLUs occupied during the process to be recorded in the section table. The compression system repeats 65 the process for next clusters until the data of the entire file are written in the compressed form and the section table is created 66. In certain embodiments of the invention, the section table may be stored out of the compressed file.

Figure 7:
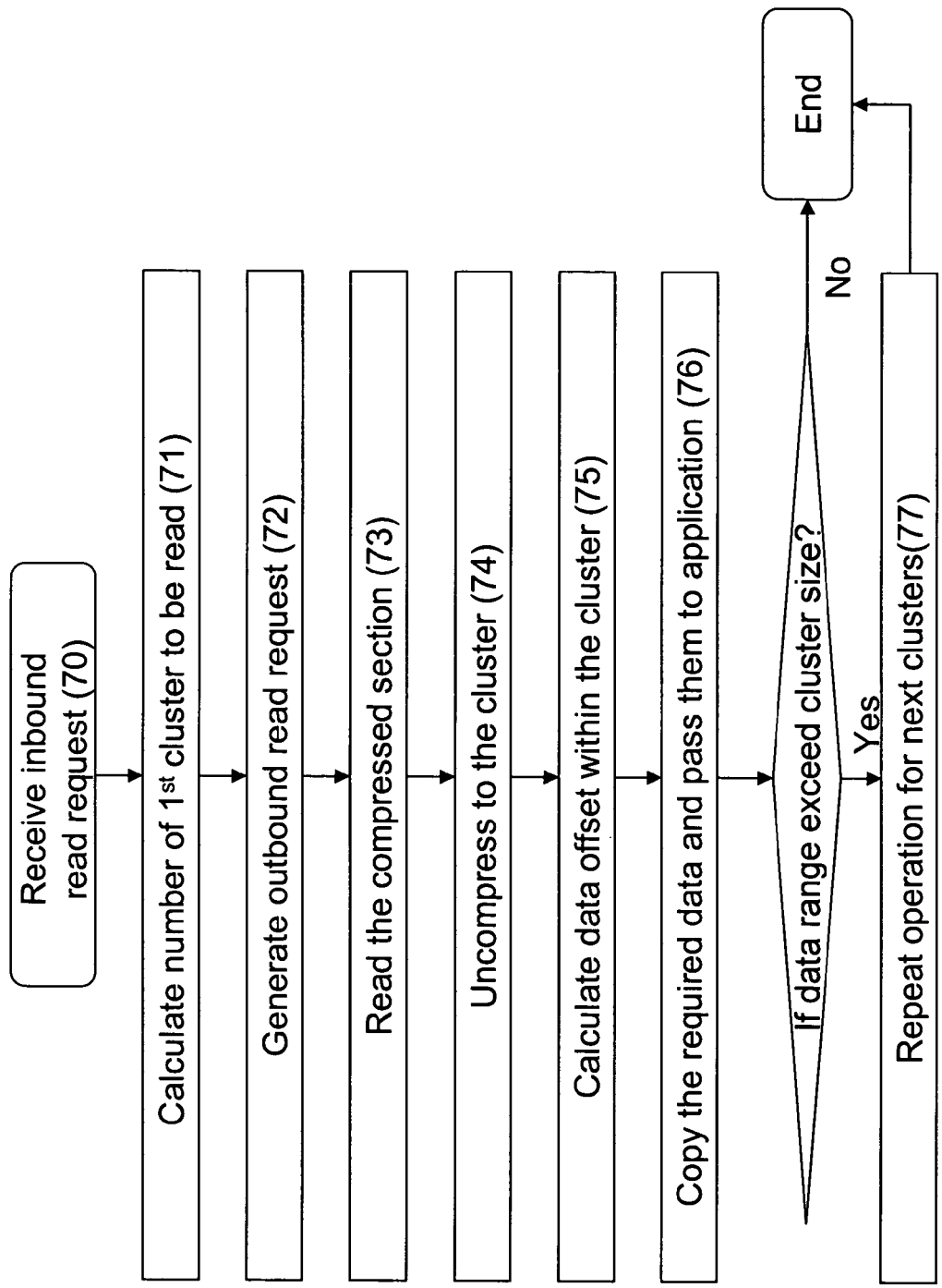
FIG. 7 is a generalized flowchart of read operation on a compressed file in accordance with certain embodiments of the present invention.

Referring to FIG. 7, there is illustrated a generalized flowchart of read operation on a compressed file in accordance with certain embodiments of the present invention.

The read operation starts with inbound read request 70 comprising input parameters (e.g. File Handle, Seek Number (data offset) and data length Y) and output parameters (e.g. target buffer address). An inbound read request identifies the offset (in raw file) and the range Y of data to read. The compression system 20 calculates 71 the serial number of the $1^{st}$ cluster to be read (hereinafter the starting cluster) as integer of (offset divided by size of the cluster) and plus one if there is a remainder. The number of clusters to be read is defined by integer of (range of data to be read divided by size of the cluster) plus one. As a result, the compression system defines the compressed section(s) with one-to-one correspondence to the clusters to be read and generates outbound read request 72. The request is based on meta-data of compressed file (header and section table) pointing to the CLUs corresponding to the compressed section(s) to be read. In certain embodiments of the invention, the offset of the section table placed at the end of compressed file may be easily calculated as following: size of compressed file minus number of clusters multiplied by fixed size of section record.

In other embodiments the compression system may be configured to facilitate association between the compressed data and the corresponding meta-data stored in a separate file.

In certain embodiments of the invention, the outbound read request may be sent specifying all the range of the data to be read. Alternatively, as illustrated in FIG. 7, the overall read request is handled in steps, and for read operation the compression system maintains a buffer substantially equal to the size of cluster. The first outbound read request comprises pointers to CLUs contained in the compresses section of the starting cluster. The entire compressed section corresponding to the starting cluster is read 73 and then uncompressed 74 by the compression system to the target buffer. At the next step the compression system calculates 75 the required offset within the cluster and copies the required data 76 to be passed to the application. The required length of copying data is calculated as follows:

$$\text{Length} = \text{Minimum }\{\text{data range } Y; (\text{cluster size} - \text{offset mod cluster size})\}$$

If the data range Y exceeds the cluster size, the operation is repeated 77.

For example, referring to the exemplary file 50, request is to read file data of 20 bytes length from the offset 1 MB+1340. Reading will start from the second cluster and, accordingly, the required data are contained in compressed file starting from $2^{nd}$ compressed section. The offset of the section table is defined as the size of compressed file minus number of clusters (4)*size of section record (72 bytes). The record of the $2^{nd}$ compressed section in the section table contains CLUs with pointers 2, 3, 7, 10, 11, 12, 15, 14. Accordingly, these CLUs will be read to a temporary buffer in the compression system 20 and uncompressed to 1 MB buffer in the compression system. Then 20 bytes from the buffer offset 1340 will be moved to the target (user's) buffer. The required length of copying data is 20 bytes (equal to minimum between 20 bytes and (1 MB-1340 bytes)). If the other request were to read file data of 2 MB length from the same offset, the operation would be repeated in a similar manner to $3^{rd}$ and $4^{th}$ compressed sections; and the required length of data copying from the starting cluster is 1 MB-1340 bytes (equal to minimum between 2 MB and (1 MB-1340 bytes)).

Figure 8:
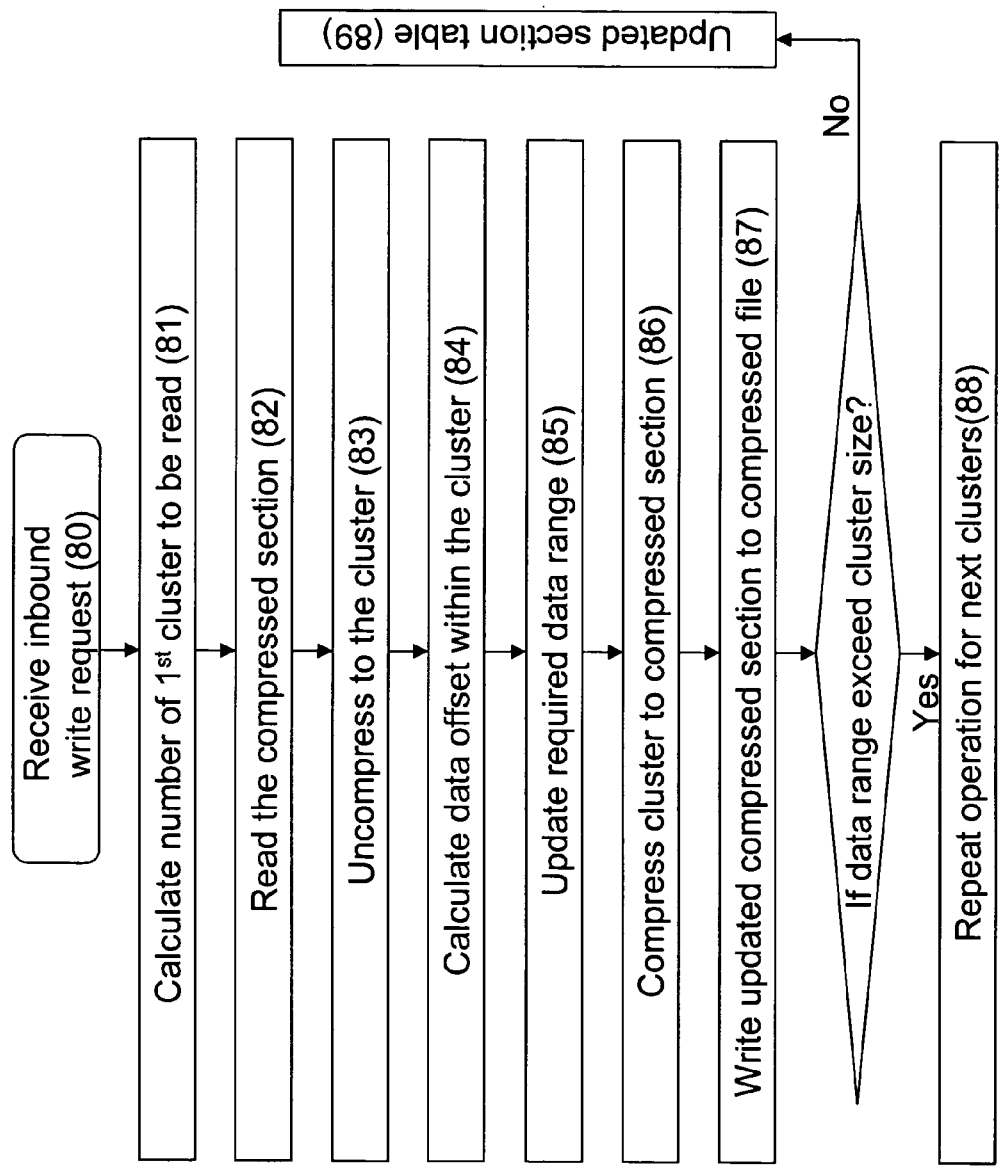
FIG. 8 is a generalized flowchart of write operation on a compressed file in accordance with certain embodiments of the present invention.

Referring to FIG. 8, there is illustrated a generalized flowchart of write operation on a compressed file in accordance with certain embodiments of the present invention. An inbound write request 80 identifies the offset (in raw file) and the range Y of data to write. The compression system 20 calculates 81 the serial number of the $1^{st}$ cluster to be updated (overwrite) as integer of (offset divided by size of the cluster) and plus one if there is a remainder. The number of clusters to overwrite is defined by integer of (range of data to write divided by size of the cluster) and plus one if there is a remainder. As a result, the compression system defines the compressed section(s) to overwrite and generates outbound read request in a manner similar to that described with reference to FIG. 7. After the entire compressed section corresponding to the starting cluster is read 82 and then uncompressed 83 by the compression system to the buffer, the compression system calculates 84 the required offset within the cluster as described with reference to FIG. 7 and updates (overwrites) the required data range 85. Then, the compression system compresses 86 the updated cluster, updates the section table and requests to write 87 the new compressed section to the compressed file. If the data range Y exceeds the cluster size, the operation is repeated 88 for successive clusters. Upon the end of the process, the compression system updates the section table 89.

As described above, in certain embodiments of the present invention the storage location of required data may be accessed directly and, accordingly, read/update (and similar) operations require restoring merely the clusters containing the required data range and not the entire files.

Figure 9:
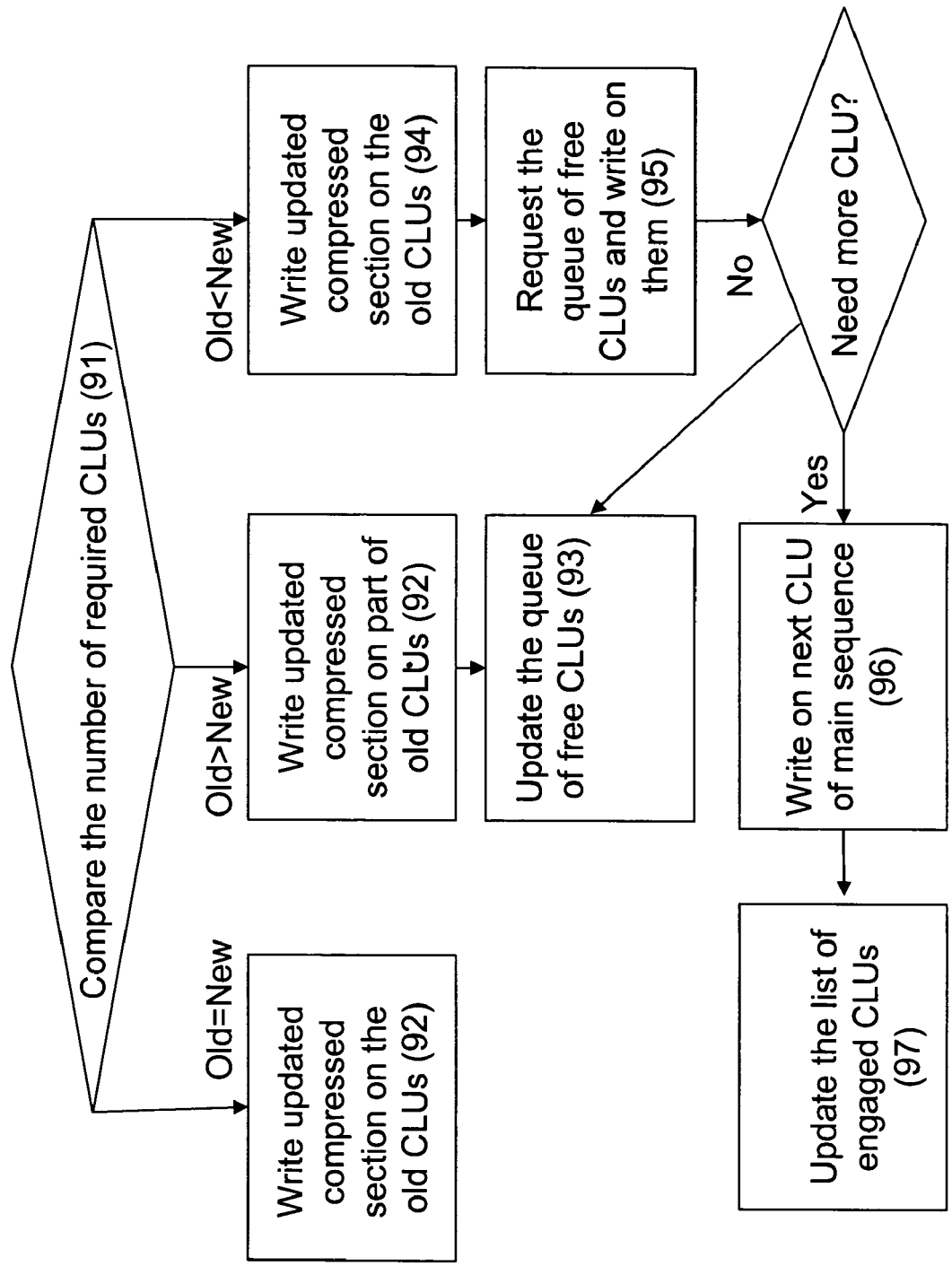
FIG. 9 is a generalized flowchart illustrating sequence of write operation on a compressed section in accordance with certain embodiments of the present invention.
Figure 10:
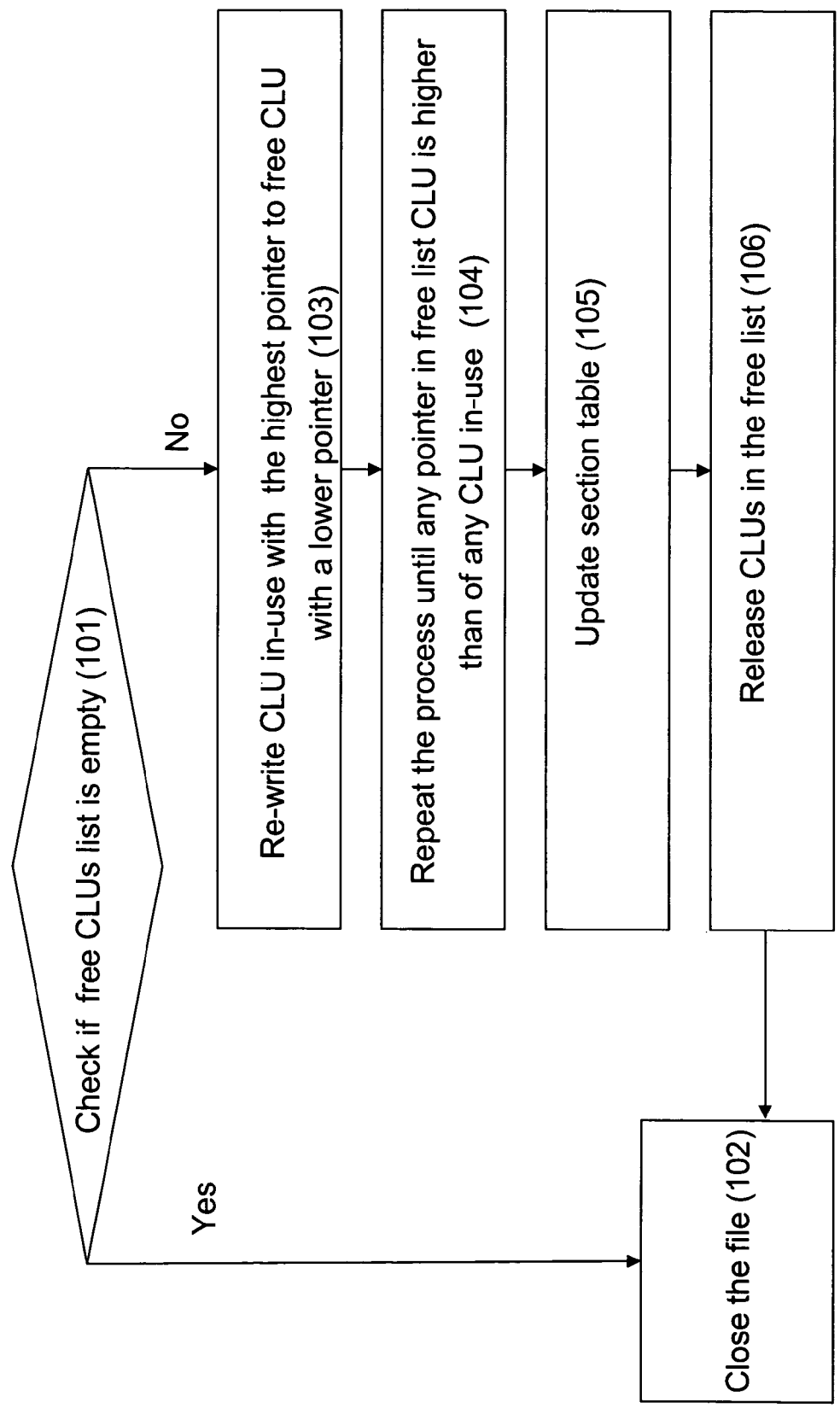
FIG. 10 is a generalized flowchart of CLU management during close operation on a file.

Typically, file updating may cause fragmentation because of unused space aroused in allocated storage. FIGS. 9 and 10 illustrate fragmentation handling algorithms of CLU management in accordance with certain embodiments of the present invention. FIG. 9 illustrates an algorithm of CLU management during write/update operation on a compressed section (step 87 in FIG. 8) in accordance with certain embodiments of the present invention. Before writing the updated compressed section, the compression system compares 91 the number of CLUs required for the updated and old compressed sections. If the number of CLUs is unchanged, the compression system 20 requests to write the updated compressed section sequentially to all CLUs 92 corresponding to the old compressed section. If the new number of the required CLUs is less than the old number, the compressed section will be written sequentially on a part of CLUs corresponding to the old compression section. The information about released CLUs is updated 93 in a special list (queue) of free CLUs handled by compression system 20 until the file is closed. If the new number of the required CLUs is more than the old number, the compressed section will be written sequentially on all CLUs corresponding to the old compression section 94 and then on CLUs taken from the free CLUs queue 95. If still more CLUs are required, the compression system will define the last CLU allocated to the file (#n) and request to write sequentially on CLUs starting with number (n+1) (96); the list of allocated CLUs will be accordingly updated 97.

In certain embodiments of the invention the last CLU in the last compressed section (as illustrated by 48-C1 in FIG. 4) may be handled in a special manner; namely, to be cut to the exact compression size if partly full. The section table will be written on the offset of the header length+(N-1)*CLU size+ $S_L$, where N is a total number of allocated CLUs and $S_L$ is the size of compressed data in the last CLU.

FIG. 10 illustrates an algorithm of CLU management during close operation on a file, in accordance with certain embodiments of the invention.

Before closing 102 the file, the compression system checks 101 if the list of free CLUs is empty. If the list still comprises CLUs, the compression system 20 defines a CLU with the highest storage location pointer among CLUs in-use. Compressed data contained in said CLU are transferred 103 to a free CLU with a lower pointer and the emptied CLU is added to the list of free CLUs. The process is repeated 104 until all the pointers of CLUs in-use are lower than the pointer of any CLU comprised in the list of free CLUs. The section table will be accordingly updated 105. Such updates may occur per each of said CLU re-writing, after the end of entire re-writing process or in accordance with other predefined criteria. Upon the end of the process the file is closed and free CLUs are released 106. The selection of a free CLU for the above process may be provided in accordance with different algorithms. For example, in certain embodiments of the invention said compressed data from the CLU with the highest storage location pointer may be transferred to the free CLU with the lowest storage location pointer.

Figure 11A:
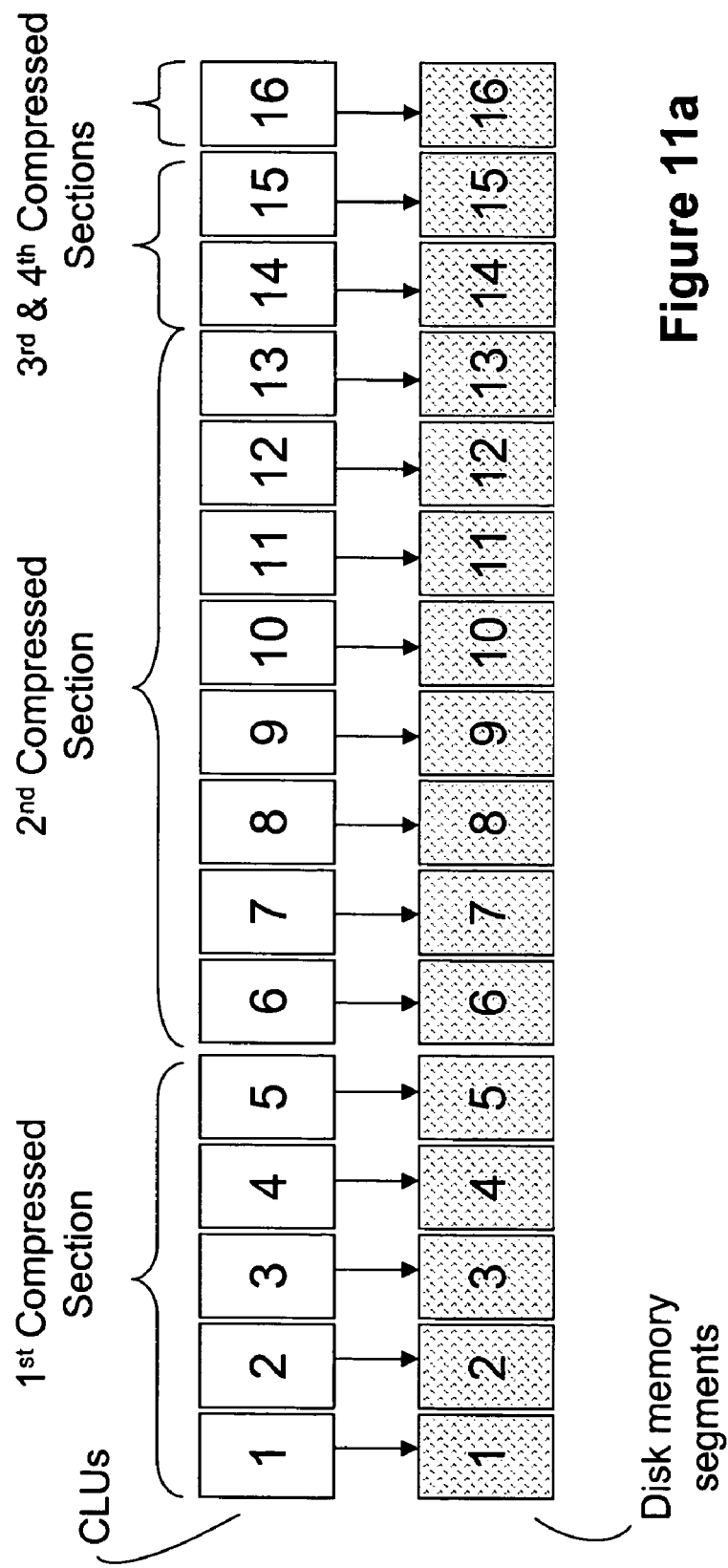
FIGS. 11a-11C are schematic illustrations of relationship between CLUs and assigned disk memory segments in accordance with certain embodiments of the present invention.
Figure 11B:
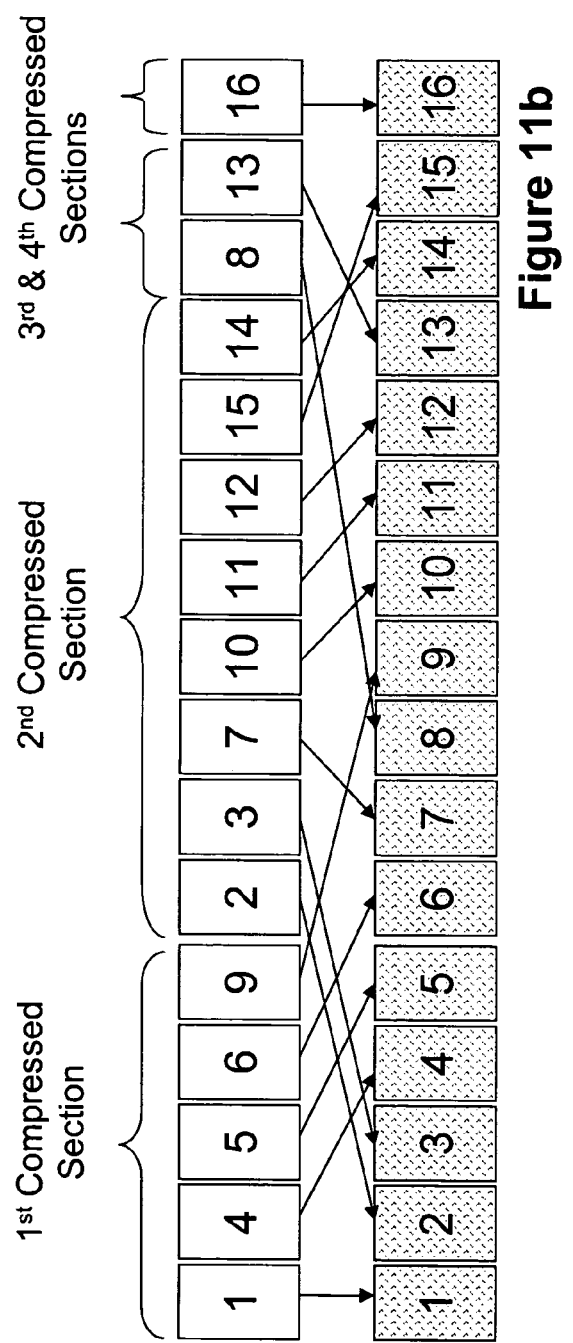
Figure 11C:
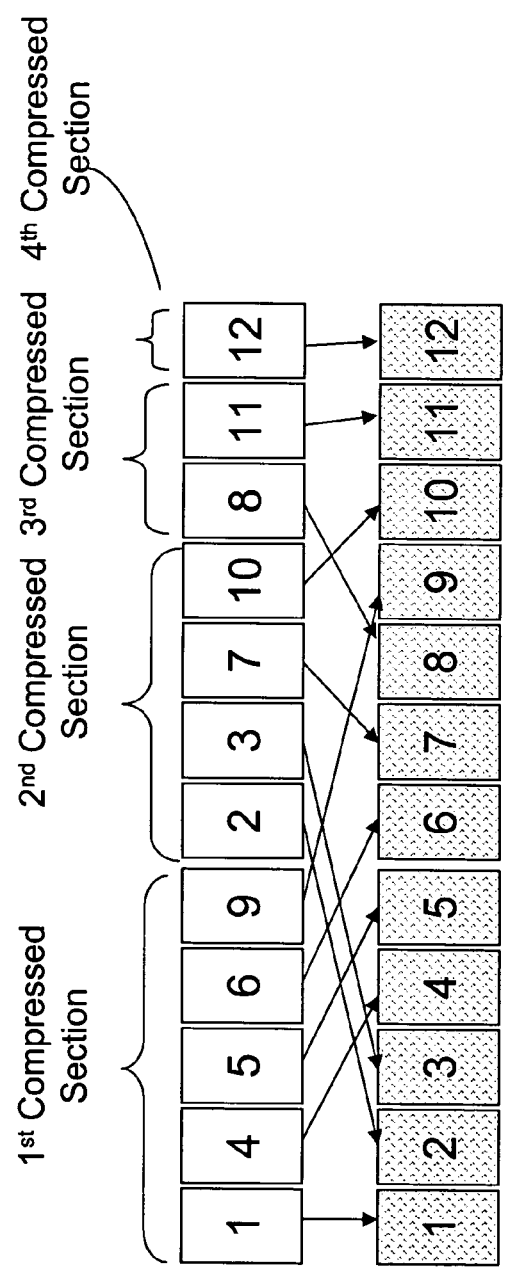

Referring to FIGS. 11*a*-11*c*, there are illustrated relationships between CLUs and assigned disk memory segments in accordance with certain embodiments of the present invention. FIG. 11*a* illustrates exemplary file 50 illustrated in FIG. 5 when created as a new compressed file. The virtual (logical) sequence of CLUs is the same as physical sequence of disk segments corresponding to the CLUs (numbers within CLUs illustrate pointers to the respective disk memory segments). FIG. 11*b* illustrates the new distribution of CLUs within the updated compressed file with unchanged size of the compressed sections as in the updated exemplary file described with reference to FIG. 5. The virtual (logical) sequence of CLUs differs from the physical sequence of disk segments corresponding to the CLUs whilst maintaining de-fragmented structure of the file. FIG. 11*c* illustrates the de-fragmented distribution of CLUs within updated exemplary compressed file 50, wherein the size of $2^{nd}$ compressed section has been changed after an update from 432111 to 200100 bytes. If, for example, the update offset is 1 MB+314 bytes, the first compressed section is unaffected during the update. The new size of $2^{nd}$ compressed section requires allocation of only 4 CLUs ([200100/61440]+1). Note, as shown in FIG. 11*b*, that before the update the second compressed section accommodated 8 CLUs (Nos. 2, 3,7,10 11, 12, 15 and 16). As described with reference to FIG. 9, the compression system 20 will write the updated $2^{nd}$ compressed section on first 4 CLUs from the compressed section (2, 3, 7, 10 in the present example) and send CLUs with pointers 11, 12, 15 and 16 to the list of free CLUs. $3^{rd}$ and $4^{th}$ compressed sections are also unaffected during this particular update. As described with reference to FIG. 10, the compression system 20 before closing the file will check if the list of free CLUs is empty. By this example the list contains CLUs with storage location pointers 11, 12, 15 and 16. As described with reference to FIG. 10, the compression system will re-write compressed data from CLU with pointer 13 to CLU with pointer 11; compressed data from CLU with pointer 16 to CLU with pointer 12 and release CLUs with pointers 13-16. Thus the updated file has 12 allocated CLUs with no de-fragmentation.

Note that the invention is not bound by the specific inbound/outbound communication between the compression system 20 and storage device 14 as described with reference to FIGS. 6-11. Those versed in the art will readily appreciate that the invention is, likewise, applicable to any other communication depending on network architecture and a manner of implementation of the compression system 20 functions. For example, if compressed files are writing to and/or reading from internal compression system resources, there is no need in generating outbound requests. Likewise, there is no need in outbound requests if the compression system functions are integrated with storage resources. Additional requirements (e.g. secure access, data integrity, etc.) may lead to more complicated communication between the compression system and the file storage device as well as entire network resources.

It is also to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the present invention.

Those skilled in the art will readily appreciate that various modifications and changes can be applied to the embodiments of the invention as hereinbefore described without departing from its scope, defined in and by the appended claims.

The invention claimed is:

1. A method of operating a compression system configured to create a compressed file for storage said method comprising:
    a) configuring the compression system to operatively interface with at least one computer and at least one storage device operable in a storage network in accordance with at least one file access storage protocol, wherein the compression system, the at least one computer and the at least one storage device are separate network entities;
    b) intercepting, by the compression system, a request addressed by said at least one computer to said at least one storage device requiring to store a raw file;
    c) compressing said raw file and thereby generating compressed data;
    d) facilitating storing the compressed data as a compressed file, the compressed file containing a header holding information identifying a substantially exact size of a corresponding raw file;
    e) intercepting, by the compression system, a file access-related request addressed by said at least one computer to said at least one storage device and referring to a size of said raw file required to be stored; and
    f) facilitating reporting the size of a corresponding raw file in accordance with said information held in the header of the stored compressed file, wherein:
    at least one fixed-size portion of data (cluster) of the raw file is sequentially processed into corresponding variable size compressed section divided into at least one fixed-size compression logical unit (CLU) and wherein the compressed file further comprises a section table comprising at least one record describing the compressed section, said record holding at least information in CLUs corresponding to the compressed section and storage location pointers pertaining to said CLUs, said method of operating the compression system further comprising:
    i) determining a serial number of first compressed section comprising data to be updated, said section giving rise to an original compressed section;
    ii) determining the CLUs corresponding to said original compressed section and storage location thereof by referring to the section table;
    iii) facilitating restoring the cluster from said original compressed section;
    iv) calculating an offset of data to be updated within said cluster and facilitating the update at the given data range;
    v) compressing the updated cluster into an updated compressed section;
    vi) facilitating overwriting said original compressed section with updated compressed section;
    vii) a dating the section table;
    viii) repeating elements ii) through vii) for compressed sections with serial numbers incremented by 1 if the range of data to be written exceeds the size of the restored clusters, until all required data are written; and
    ix) handling a list of free CLUs released during writing data to the compressed file, said list being handled during all sessions related to the file until the file is closed.

2. The method of claim 1, wherein a record of the compressed file in a file system of the storage device comprises a field holding information identifying the size of the corresponding raw file.

3. The method of claim 2, wherein a locking operation on the compressed file is provided in accordance with information identifying the size of the corresponding raw file comprised in the record of the compressed file in the file system of the storage device.

4. The method of claim 1, further comprising:
    I) checking the list of free CLUs before closing the file;
    II) if said list is not empty, defining a CLU with the highest storage location pointer among CLUs comprised in the compressed sections (first CLU);
    III) facilitating moving the compressed data from said first CLU to a free CLU with lower storage location pointer (second CLU);
    IV) assigning said second CLU to pertaining compressed section and said first CLU to the list of free CLUs;
    V) repeating elements II through IV until the storage location pointers of all CLUs comprised in compressed sections are lower than a pointer of any of CLU comprising in the list of free CLUs; and
    VI) updating the section table.

5. The method of claim 1, wherein the compression system is at least partly integrated with a communication device operable in a storage network.

6. The method of claim 1, wherein the compression system is at least partly integrated with a storage device operable with at least one file access protocol.

7. The method of claim 1, wherein the file access storage protocol is a protocol that supports network attached storage (NAS).

8. For use with a file access storage, a computer useable physical medium having computer readable program code embodied therein for performing all the steps of claim 1 when said computer readable program code is run on a computer.

9. A method of operating a compression system configured to create a compressed file for storage, said method comprising:
   a) configuring the compression system to operatively interface with at least one computer and at least one storage device operable in a storage network in accordance with at least one file access storage protocol, wherein the compression system, the at least one computer and the at least one storage device are separate network entities;
   b) intercepting, by the compression system, a request addressed by said at least one computer to said at least one storage device requiring to store a raw file;
   c) compressing said raw file and thereby generating compressed data;
   d) facilitating storing the compressed data as a compressed file, the compressed file containing a header holding information identifying a substantially exact size of corresponding raw file;
   e) intercepting, by the compression system, a file access-related request addressed by said at least one computer to said at least on storage device and referring to a size of said raw file required to be stored; and
   f) facilitating a locking operation on the compressed fie in accordance with the size of the corresponding raw file, wherein information identifying the size of the corresponding raw file is derived from the header of the compressed file, wherein:
      at least one fixed-size portion of data (cluster) of the raw file is sequentially processed into corresponding variable size compressed section divided into at least one fixed-size compression logical unit (CLU) and wherein the compressed file further comprises a section table comprising at least one record describing the compressed section, said record holding at least information in CLUs corresponding to the compressed section and storage location pointers pertaining to said CLUs, said method of operating the compression system further comprising:
      i) determining a serial number of first compressed section comprising data to be updated, said section giving rise to an original compressed section;
      ii) determining the CLUs corresponding to said original compressed section and storage location thereof by referring to the section table;
      iii) facilitating restoring the cluster from said original compressed section;
      iv) calculating an offset of data to be u s dated within said cluster and facilitating the update at the given data range;
      v) compressing the updated cluster into an updated compressed section;
      vi) facilitating overwriting said original compressed section with updated compressed section;
      vii) updating the section table;
      viii) repeating elements ii) through vii) for compressed sections with serial numbers incremented by 1 if the range of data to be written exceeds the size of the restored clusters, until all required data are written; and
      ix) handling a list of free CLUs released during writing data to the compressed file, said list being handled during all sessions related to the file until the file is closed.

10. The method of claim 9, wherein a record of the compressed file in a file system of the storage device comprises a field holding information identifying the size of the corresponding raw file.

11. The method of claim 9, further comprising:
   I) checking the list of free CLUs before closing the file;
   II) if said list is not empty, defining a CLU with the highest storage location pointer among CLUs comprised in the compressed sections (first CLU);
   III) facilitating moving the compressed data from said first CLU to a free CLU with lower storage location pointer (second CLU);
   IV) assigning said second CLU to pertaining compressed section and said first CLU to the list of free CLUs;
   V) repeating II to IV until the storage location pointers of all CLUs comprised in compressed sections are lower than a pointer of any of CLU comprising in the list of free CLUs; and
   VI) updating the section table.

12. The method of claim 9, wherein the compression system is at least partly integrated with a communication device operable in a storage network.

13. The method of claim 9, wherein the compression system is at least partly integrated with a storage device operable with at least one file access protocol.

14. The method of claim 9, wherein the file access storage protocol is a protocol that supports network attached storage (NAS).

15. For use with a file access storage, a computer useable physical medium having computer readable program code embodied therein for performing all the steps of claim 9 when said computer readable program code is run on a computer.

16. A system for compressing files for storage, the system comprising:
   a) a compression block configured to compress a raw file and thereby generate compressed data;
   b) a storage input/output block configured to intercept one or more file access-related requests from said at least one computer addressed to said at least one storage device and to facilitate storing the compressed data as a compressed file, the compressed file containing a header holding information identifying a substantially exact size of the raw file; and
   c) a file manager operatively coupled to the compression block and to the storage input/output block and configured to enable reporting, in response to an intercepted file access-related request referring to a size of a certain stored raw file, the size of a corresponding raw file in accordance with said information held in the header of said certain stored compressed file,
   wherein said system is operatively coupled to at least one computer and at least one storage device operable in a storage network in accordance with at least one file access storage protocol, and
   wherein the compression system, the at least one computer and the at least one storage device are separate network entities, wherein:
      at least one fixed-size portion of data (cluster) of the raw file is sequentially processed into corresponding variable size compressed section divided into at least one fixed-size compression logical unit (CLU) and wherein the compressed file further comprises a section table comprising at least one record describing the compressed section, said record holding at least information in CLUs corresponding to the compressed section and storage location pointers pertaining to said CLUs, said compression system further configured to:
i) determine a serial number of first compressed section comprising data to be updated, said section giving rise to an original compressed section;
ii) determine the CLUs corresponding to said original compressed section and storage location thereof by referring to the section table;
iii) facilitate restoring the cluster from said original compressed section;
iv) calculate an offset of data to be updated within said cluster and facilitating the update at the given data range;
v) compress the updated cluster into an updated compressed section;
vi) facilitate overwriting said original compressed section with updated compressed section;
vii) update the section table;
viii) repeate elements ii) through vii) for compressed sections with serial numbers incremented by 1 if the range of data to be written exceeds the size of the restored clusters, until all required data are written; and
ix) handle a list of free CLUs released during writing data to the compressed file, said list being handled during all sessions related to the file until the file is closed.

17. The system of claim 16 constituting a part of a communication device operable in a storage network.

18. The system of claim 16 constituting a part of a storage device operable with at least one file access protocol.

19. The system of claim 16, wherein a record of the compressed file in a file system of the storage device comprises a field holding information identifying the size of the corresponding raw file.

20. The system of claim 16, wherein the compression system in further configured to:
   I) check the list of free CLUs before closing the file;
   II) if said list is not empty, define a CLU with the highest storage location pointer among CLUs comprised in the compressed sections (first CLU);
   III) facilitate moving the compressed data from said first CLU to a free CLU with lower storage location pointer (second CLU);
   IV) assign said second CLU to pertaining compressed section and said first CLU to the list of free CLUs;
   V) repeat elements II through IV until the storage location pointers of all CLUs comprised in compressed sections are lower than a pointer of any of CLU comprising in the list of free CLUs; and
   VI) update the section table.

21. The system of claim 16, wherein the compression system is at least partly integrated with a communication device operable in a storage network.

22. The system of claim 16, wherein the compression system is at least partly integrated with a storage device operable with at least one file access protocol.

23. The system of claim 16, wherein the file access storage protocol is a protocol that supports network attached storage (NAS).

* * * * *

UNITED STATES PATENT AND TRADEMARK OFFICE
CERTIFICATE OF CORRECTION

| | | |
|---|---|---|
| PATENT NO. | : 7,979,403 B2 | Page 1 of 1 |
| APPLICATION NO. | : 11/401424 | |
| DATED | : July 12, 2011 | |
| INVENTOR(S) | : Nadav Kedem, Jonathan Amit and Noah Amit | |

It is certified that error appears in the above-identified patent and that said Letters Patent is hereby corrected as shown below:

Title page, item [75] inventor: Noach Amit should read as follows: --Noah Amit--

Signed and Sealed this
Third Day of January, 2012

David J. Kappos
*Director of the United States Patent and Trademark Office*